United States Patent
Hotta et al.

(10) Patent No.: US 9,899,306 B2
(45) Date of Patent: Feb. 20, 2018

(54) ANISOTROPIC CONDUCTIVE MEMBER AND MULTILAYER WIRING SUBSTRATE

(71) Applicant: FUJIFILM Corporation, Tokyo (JP)

(72) Inventors: Yoshinori Hotta, Shizuoka (JP); Shunji Kurooka, Shizuoka (JP); Kosuke Yamashita, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/401,778

(22) Filed: Jan. 9, 2017

(65) Prior Publication Data

US 2017/0125330 A1 May 4, 2017

Related U.S. Application Data

(63) Continuation of application No. PCT/JP2015/069776, filed on Jul. 9, 2015.

(30) Foreign Application Priority Data

Jul. 11, 2014 (JP) ................................. 2014-143542
Sep. 10, 2014 (JP) ................................. 2014-184292
(Continued)

(51) Int. Cl.
*H01L 23/498* (2006.01)
*H05K 1/14* (2006.01)
*H05K 1/03* (2006.01)

(52) U.S. Cl.
CPC .. *H01L 23/49822* (2013.01); *H01L 23/49827* (2013.01); *H05K 1/03* (2013.01); *H05K 1/144* (2013.01)

(58) Field of Classification Search
CPC .............................. H05K 1/144; H05K 1/0306
See application file for complete search history.

(56) References Cited

U.S. PATENT DOCUMENTS

2008/0156522 A1* 7/2008 Shimada ........... H01L 23/49827
174/262
2010/0294547 A1* 11/2010 Hatanaka .......... H01L 23/49827
174/257
(Continued)

FOREIGN PATENT DOCUMENTS

JP 62-234804 A 10/1987
JP 4-363811 A 12/1992
(Continued)

OTHER PUBLICATIONS

International Preliminary Report on Patentability and translation of Written Opinion, dated Jan. 26, 2017, from the International Bureau in counterpart International Application No. PCT/JP2015/069776.
(Continued)

*Primary Examiner* — Timothy Thompson
*Assistant Examiner* — Amol Patel
(74) *Attorney, Agent, or Firm* — Sughrue Mion, PLLC

(57) ABSTRACT

An object of the present invention is to provide an anisotropic conductive member capable of achieving excellent conduction reliability and a multilayer wiring substrate using the same. The anisotropic conductive member of the present invention includes an insulating base which is made of an inorganic material, a plurality of conductive paths which are made of a conductive member, penetrate the insulating base in a thickness direction thereof and are provided in a mutually insulated state, and a pressure sensitive adhesive layer which is provided on a surface of the insulating base, in which each of the conductive paths has a protrusion which protrudes from the surface of the insulating base, and an end of the protrusion of each of the conductive paths is exposed or protrudes from the surface of the pressure sensitive adhesive layer.

14 Claims, 8 Drawing Sheets

(30) Foreign Application Priority Data

Apr. 13, 2015 (JP) ................................. 2015-081954
May 22, 2015 (JP) ................................. 2015-104430

(56) References Cited

U.S. PATENT DOCUMENTS

2011/0117357 A1* 5/2011 Hatanaka ................ H01L 24/29
 428/312.8
2014/0321075 A1* 10/2014 Sung ...................... H05K 1/118
 361/750

FOREIGN PATENT DOCUMENTS

| | | |
|---|---|---|
| JP | 2002-76056 A | 3/2002 |
| JP | 2003123867 A | 4/2003 |
| JP | 2009164095 A | 7/2009 |
| JP | 2010-067589 A | 3/2010 |
| JP | 2014-71962 A | 4/2014 |

OTHER PUBLICATIONS

International Search Report for PCT/JP2015/069776 dated Sep. 15, 2015.

Notification of Reasons for Refusal, dated Nov. 7, 2017, issued in corresponding JP Application No. 2016-532968, 9 pages in English and Japanese.

Notification of Reason for Refusal, dispatched Nov. 27, 2017, issued in KR Application No. 10-2016-7033537, 12 pages in English and Korean.

* cited by examiner

25°C

250°C

300°C

400°C

500°C

ANISOTROPIC CONDUCTIVE MEMBER AND MULTILAYER WIRING SUBSTRATE

CROSS-REFERENCE TO RELATED APPLICATIONS

This application is a Continuation of PCT International Application No. PCT/JP2015/069776 filed on Jul. 9, 2015, which claims priority under 35 U.S.C. §119(a) to Japanese Patent Application No. 2014-143542 filed on Jul. 11, 2014, Japanese Patent Application No. 2014-184292 filed on Sep. 10, 2014, Japanese Patent Application No. 2015-081954 filed on Apr. 13, 2015 and Japanese Patent Application No. 2015-104430 filed on May 22, 2015. Each of the above application(s) is hereby expressly incorporated by reference, in its entirety, into the present application.

BACKGROUND OF THE INVENTION

1. Field of the Invention

The present invention relates to an anisotropic conductive member and a multilayer wiring substrate.

2. Description of the Related Art

A metal filled microstructure (device) that is obtained by filling micropores provided in an insulating base with a metal is one of the fields which have attracted attention in recent nanotechnologies. For example, it is expected that a metal filled microstructure will be used for an anisotropic conductive member.

An anisotropic conductive member is inserted between an electronic component such as a semiconductor element and a circuit board, and electrical connection is obtained between the electronic component and the circuit board by simply applying pressure to the anisotropic conductive member. Thus, an anisotropic conductive member is widely used, for example, as an electrical connection member for an electronic component such as a semiconductor element or as a connector for inspection in a functional test.

Particularly, downsizing of electronic components such as a semiconductor element remarkably occurs and since conventional methods such as wire bonding in which wiring substrates are directly connected, flip chip bonding, and thermocompression bonding cannot secure sufficient connection stability, an anisotropic conductive member is attracting attention as an electronic connection member.

As a microstructure which can be used for an anisotropic conductive member, for example, JP2010-067589A discloses a "microstructure including an insulating base having micropore through holes having an opening diameter of 10 to 500 nm at a density of $1 \times 10^6$ to $1 \times 10^{10}$/mm$^2$, in which the micropore through holes are filled with a metal at a filling rate of 30% or more, and a layer made of a polymer is provided on at least one surface of the insulating base" ([Claim 1]).

SUMMARY OF THE INVENTION

As a result of investigations of the microstructure described in JP2010-067589A, the present inventors found that, since protrusions (bumps) of conductive paths are in a state in which the bumps are covered by the polymer layer in the microstructure (JP2010-067589A: refer to [0038], [FIG. 2], and the like), the presence of the polymer layer by which the protrusions of the conductive paths are covered disturbs conduction depending on the material and thickness of the polymer layer or the shape and pitch of the electrodes to be connected, and the like and thus conduction reliability deteriorates in some cases.

An object of the present invention is to provide an anisotropic conductive member capable of achieving excellent conduction reliability, and a multilayer wiring substrate using the same.

As a result of thorough study for achieving the above-described object, the present inventors found that excellent conduction reliability can be achieved by providing a pressure sensitive adhesive layer on the surface of an insulating base and causing ends of protrusions of plural conductive paths, which penetrate the insulating base in a thickness direction thereof, to be exposed or protrude from the surface of the pressure sensitive adhesive layer, thereby completing the present invention.

That is, the present inventors found that the above-described object can be achieved by employing the following configurations.

[1] An anisotropic conductive member comprising:
an insulating base which is made of an inorganic material;
a plurality of conductive paths which are made of a conductive member, penetrate the insulating base in a thickness direction thereof and are provided in a mutually insulated state; and
a pressure sensitive adhesive layer which is provided on a surface of the insulating base,
in which each of the conductive paths has a protrusion which protrudes from the surface of the insulating base, and
an end of the protrusion of each of the conductive paths is exposed or protrudes from the surface of the pressure sensitive adhesive layer.

[2] The anisotropic conductive member according to [1], in which an aspect ratio of the protrusion of each of the conductive paths is 0.01 or more and less than 20, where the aspect ratio is a ratio of height to diameter of the protrusion.

[3] The anisotropic conductive member according to [1] or [2], in which the height of the protrusion of each of the conductive paths is 50 nm to 1,500 nm.

[4] The anisotropic conductive member according to any one of [1] to [3], in which a thickness of the pressure sensitive adhesive layer is 50 nm to 1,500 nm.

[5] The anisotropic conductive member according to any one of [1] to [4], in which an absolute value of a difference between the height of the protrusion of each of the conductive paths and the thickness of the pressure sensitive adhesive layer is 0 nm to 50 nm.

[6] The anisotropic conductive member according to any one of [1] to [5], in which the pressure sensitive adhesive layer is a layer which contains a polymer material having a thermal expansion coefficient of less than $50 \times 10^{-6}$ K$^{-1}$.

[7] The anisotropic conductive member according to [6], in which the polymer material is at least one resin material selected from the group consisting of polyimide resins and epoxy resins.

[8] A multilayer wiring substrate in which the anisotropic conductive member according to any one of [1] to [7] and a wiring substrate which is electrically connected to the conductive material of the anisotropic conductive member via an electrode are laminated.

[9] The multilayer wiring substrate according to [8] which is used as an interposer for a semiconductor package.

As described above, according to the present invention, it is possible to provide an anisotropic conductive member capable of achieving excellent conduction reliability and a multilayer wiring substrate using the same.

BRIEF DESCRIPTION OF THE DRAWINGS

FIG. 5A is a top view, and FIG. 5B is a cross-sectional view of FIG. 5A when viewed from a cutting line IB-IB.

DESCRIPTION OF THE PREFERRED EMBODIMENTS

Hereinafter, the present invention will be described in detail.

The description of the constitution requirements to be described below is made on the basis of representative embodiments of the present invention, but the present invention is not limited to these embodiments.

The numerical range represented by the term "to" in the specification includes the numerical values set forth before and after "to" as lower and upper limits, respectively.

[Anisotropic Conductive Member]

An anisotropic conductive member of the present invention includes an insulating base which is made of an inorganic material, plural conductive paths which are made of a conductive member, penetrate the insulating base in a thickness direction thereof and are provided in a mutually insulated state, and a pressure sensitive adhesive layer which is provided on a surface of the insulating base.

In addition, each of the conductive paths has a protrusion which protrudes from the surface of the insulating base, and an end of the protrusion of each of the conductive paths is exposed or protrudes from the surface of the pressure sensitive adhesive layer.

In the anisotropic conductive member of the present invention, as described above, by adopting a configuration in which a pressure sensitive adhesive layer is provided on the surface of the insulating base and the ends of the protrusions of the plural conductive paths which penetrate the insulating base in the thickness direction thereof are provided to be exposed or protrude from the surface of the pressure sensitive adhesive layer, excellent conduction reliability can be achieved.

Although the details are not clear, it is assumed as follows.

That is, it is considered that when electrodes of a semiconductor element or a wiring substrate and an anisotropic conductive member are connected (bonded), the electrodes and the conductive paths in the anisotropic conductive member are bonded, while or after bonding, the pressure sensitive adhesive layer in the anisotropic conductive member is bonded to portions of the wiring substrate other than the electrodes, and a gap between the wiring substrate and the anisotropic conductive member is filled with the pressure sensitive adhesive layer without disturbing the connection between the electrodes and the conductive paths.

As shown in Examples and Comparative example which will be described later, the connection (bonding) between electrodes of a semiconductor element or a wiring substrate and an anisotropic conductive member can be carried out at a lower temperature and a lower pressure for a shorter period of time compared to in the related art, which also contributes to achieving excellent conduction reliability.

Although the details of the reason why the bonding can be carried out at a low temperature and a low pressure for a short period of time is not clear, it is assumed as follows.

Figure 1:
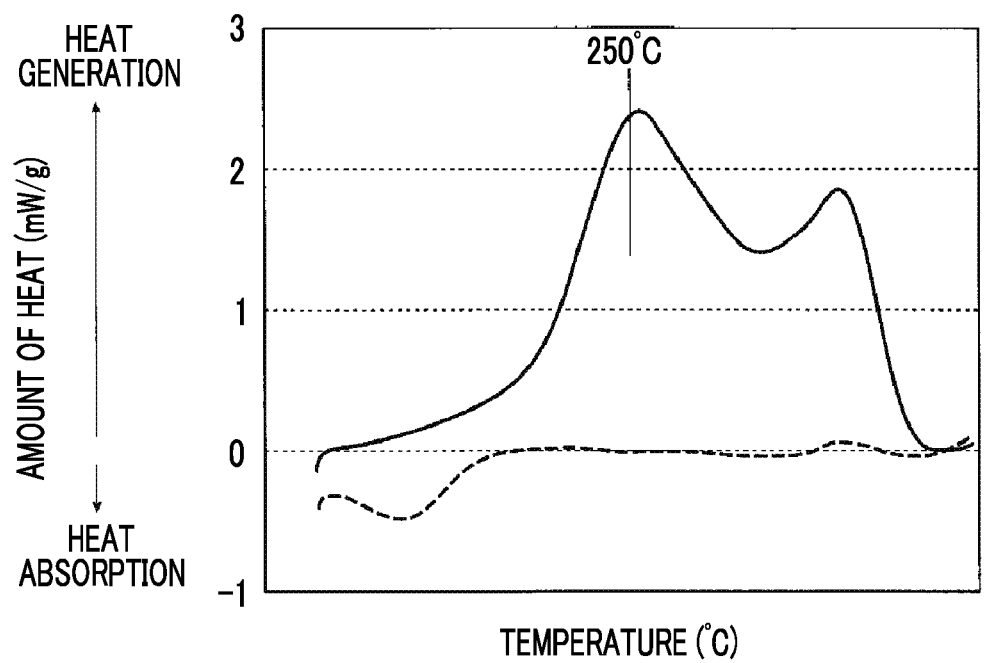
FIG. 1 shows an analysis result of differential scanning calorimetry (DSC) of a conductive member constituting conductive paths.
Figure 2A:
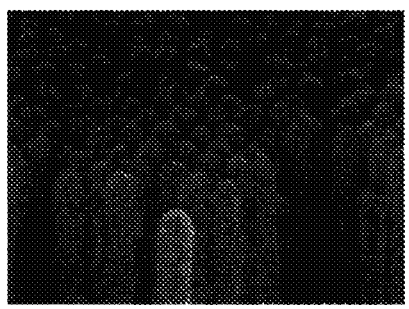
FIGS. 2A to 2E are respective images of protrusions of conductive paths of an anisotropic conductive member at each temperature of 25° C., 250° C., 300° C., 400° C., and 500° C. obtained using a scanning electron microscope (SEM).
Figure 2B:
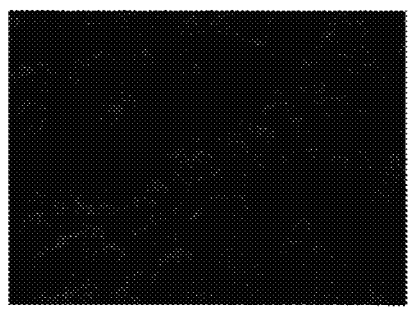
Figure 2C:
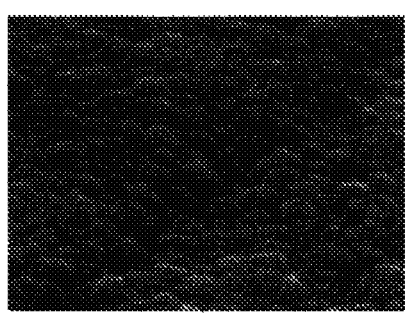
Figure 2D:
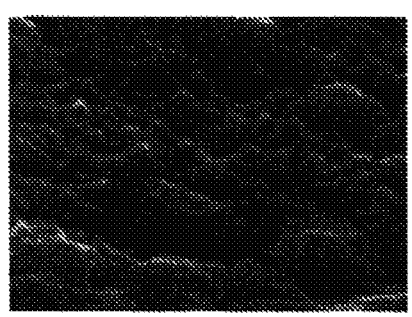
Figure 2E:
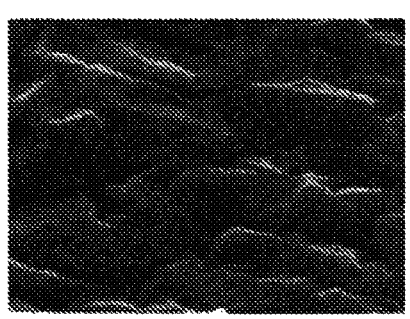

First, it is thought that there is internal strain in the conductive paths (conductive member) which penetrate the insulating base in the thickness direction thereof upon a conductive path forming step, which will be described later. Further, it is thought that the energy generated by the strain becomes a dropping force and this force induces solid phase diffusion with application of little energy. These assumptions can be also confirmed from an apparent exothermic peak being exhibited at 250° C. from the analysis result of DSC of the conductive member constituting the conductive paths as shown in FIG. 1 (refer to a solid line in FIG. 1). That is, it is thought that since according to the measurement principle of DSC, in a case in which a melting phenomenon occurs, heat absorption is observed, and in a case in which recrystallization or the like occurs, heat generation is observed, bonding of the anisotropic conductive member is a phenomenon which is associated with solid phase diffusion, that is, structure reformation by diffusion induced recrystallization (DIR). On the other hand, it is thought that since the exothermic peak of the material for heating the conductive member constituting the conductive paths to raise the temperature to 500° C. is not observed (refer to a broken line in FIG. 1), the energy generated by internal strain resulting from heating is released and recrystallization occurs.

Figure 3:
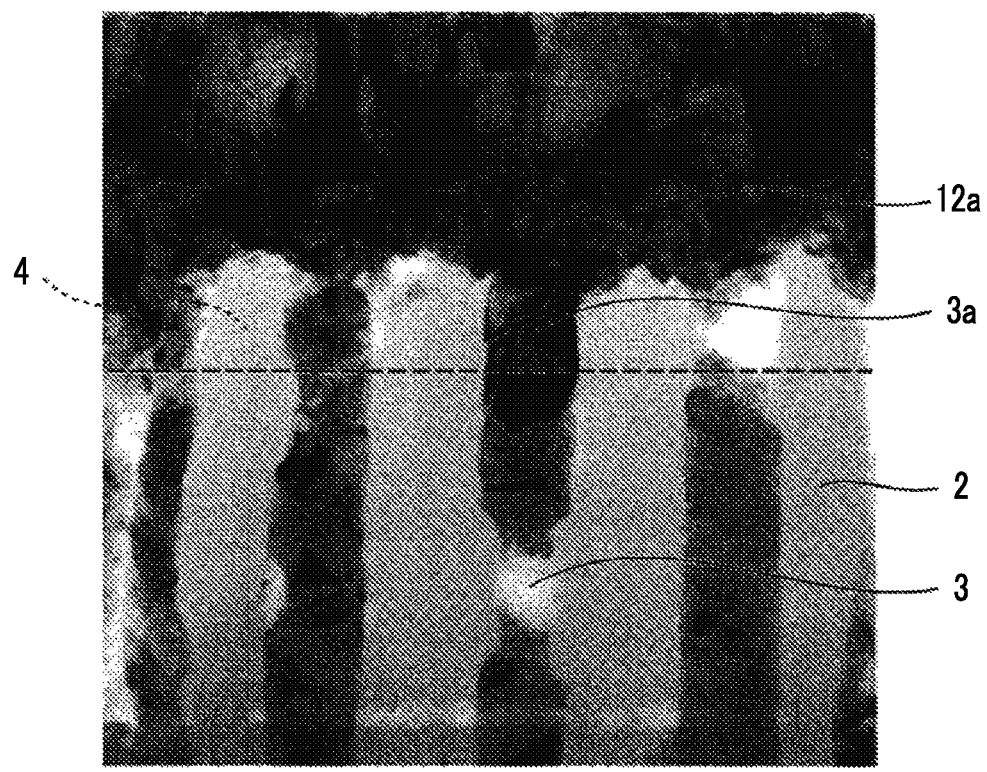
FIG. 3 is an SEM image of a cross section of a bonding portion formed when an electrode and an anisotropic conductive member are bonded at 250° C.
Figure 4:
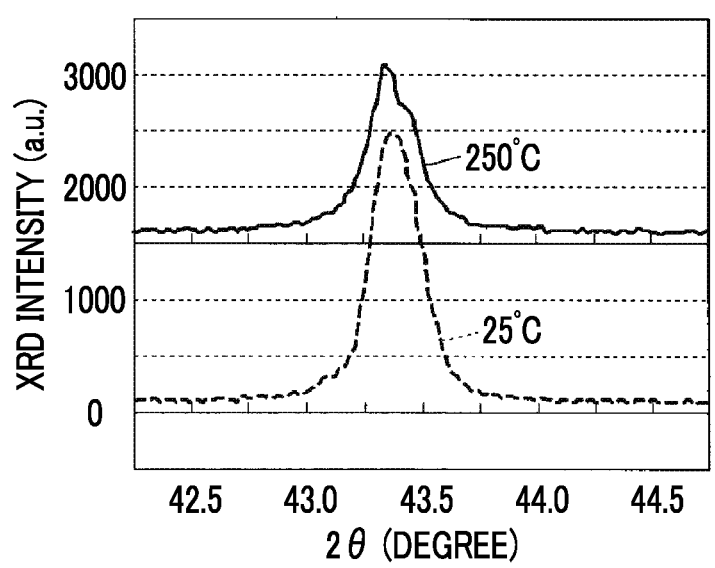
FIG. 4 shows an analysis result of crystal diffraction (X-ray diffraction) of a copper material at the interfaces between protrusions of conductive paths and an electrode.

Regarding the recrystallization, it can be observed that a recrystallized structure is formed in the protrusion of each of the conductive paths of the anisotropic conductive member by heating (for example, at a temperature of 200° C. or higher) during bonding from SEM images at each temperature of 25° C., 250° C., 300° C., 400° C., and 500° C. as shown in FIGS. 2A to 2E. Further, as shown in FIG. 3, from an SEM image of a cross section of a bonding portion formed when the electrode and the anisotropic conductive member are actually bonded at 250° C., the interface between a protrusion 3a of the conductive path and an electrode 12a is hardly recognizable and the formation of a recrystallized structure can be observed. In addition, as shown in FIG. 4, when the conductive member (copper in FIG. 4) at the interface between the protrusion 3a of the conductive path and the electrode 12a is analyzed by crystal diffraction, a double peak of the diffraction line which is considered to respond the alignment of the crystal plane is observed and thus it can be assumed that a recrystallized structure is formed.

In the case of considering a solid phase diffusion rate of metal in a bulk state, it is thought that a phenomenon accompanying a change in shape such as recrystallization hardly occurs. However, it is reported that the solid phase diffusion rate on the surface of metal is increased by about six orders compared to the solid phase diffusion rate inside metal and it is sufficiently thought that a change in shape may occur even in the protrusions of the conductive paths.

Next, the configuration of the anisotropic conductive member of the present invention will be described using FIGS. 5A and 5B.

Figure 5A:
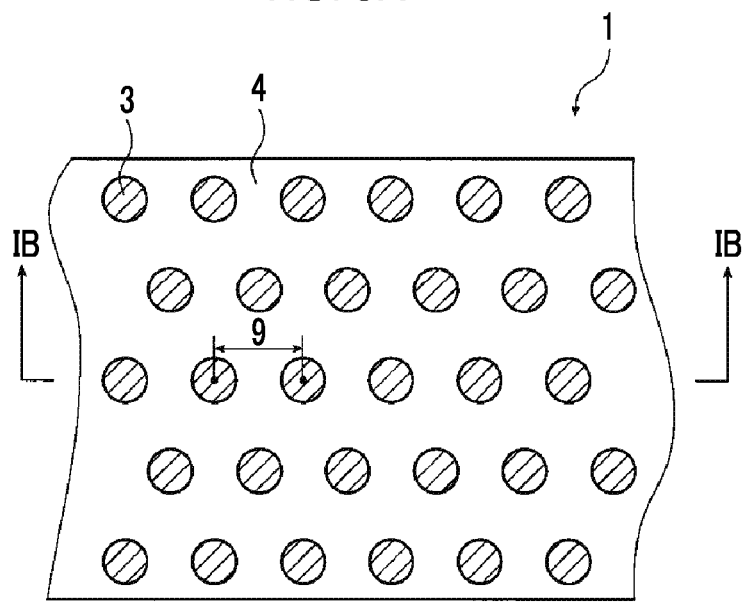
FIGS. 5A and 5B are schematic views showing an example of a preferable embodiment of an anisotropic conductive member of the present invention.
Figure 5B:
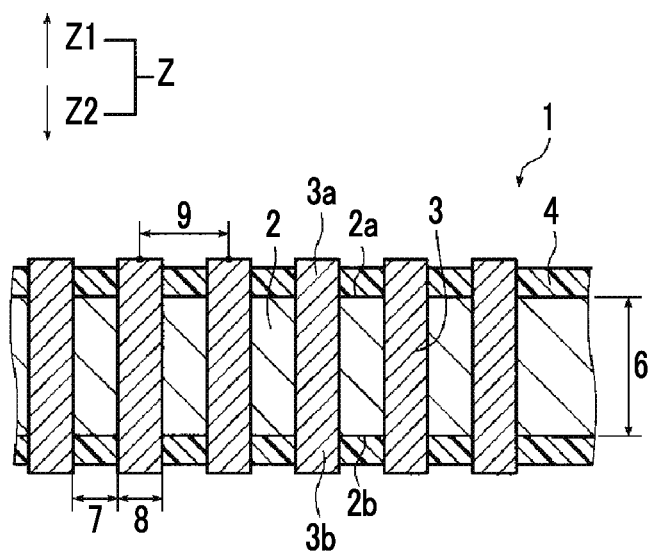

An anisotropic conductive member 1 shown in FIGS. 5A and 5B includes an insulating base 2, plural conductive paths 3 which is made of a conductive member, and a pressure sensitive adhesive layer 4 which is provided on surfaces 2a and 2b of the insulating base 2.

In addition, the conductive paths 3 are provided to penetrate the insulating base 2 in a mutually insulated state in a thickness direction Z thereof (Z1: a direction from the rear surface to the front surface in FIG. 5A, Z2: a direction from the front surface to the rear surface in FIG. 5A) as shown in FIGS. 5A and 5B.

Further, as shown in FIG. 5B, the conductive paths 3 have protrusions 3a and 3b which protrude from the surfaces 2a and 2b of the insulating base 2 and the ends of the protrusions 3a and 3b are provided to be exposed or protrude from the surface of the pressure sensitive adhesive layer 4.

Figure 6A:
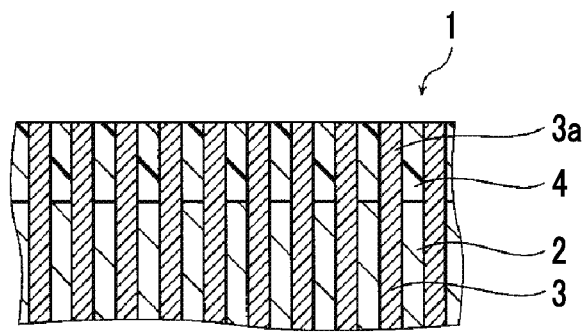
FIGS. 6A to 6C are schematic cross-sectional views respectively showing examples of embodiments of the anisotropic conductive member of the present invention.
Figure 6B:
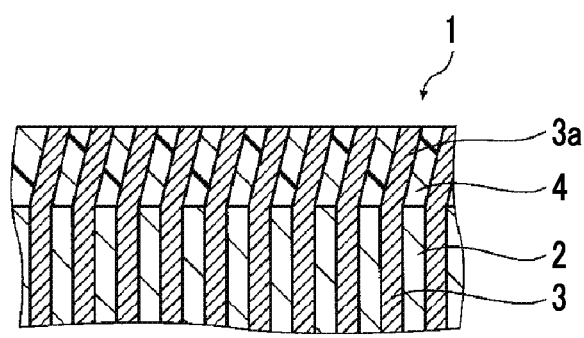
Figure 6C:
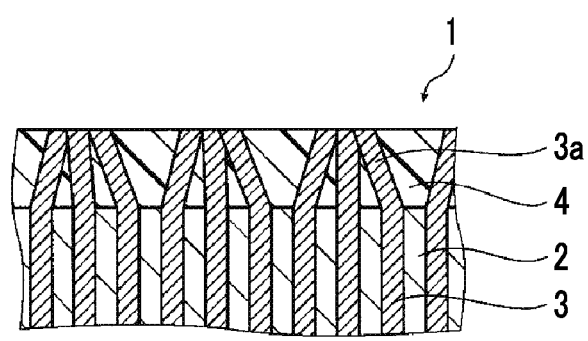

Here, the "mutually insulated state" means that each of the conductive paths present in the insulating base (in the thickness direction) is in a mutually insulated state in the insulating base and as shown in FIG. 6C which will be described later, plural protrusions may be bonded in the protrusions that protrude from the surface of the insulating base.

In addition, in FIG. 5B, an embodiment in which the pressure sensitive adhesive layer 4 is provided on the surfaces 2a and 2b of the insulating base 2 is shown but in the present invention, the pressure sensitive adhesive layer may be provided on at least one surface of the insulating base.

In the same manner, in FIG. 5B, an embodiment in which both ends of the conductive path 3 have protrusions (reference numerals 3a and 3b) is shown but in the present invention, the ends of the conductive path may have protrusions that protrude from the surface of the insulating base on the side on which at least the pressure sensitive adhesive layer is provided.

Next, the materials and sizes of the insulating base, the conductive paths and the pressure sensitive adhesive layer of the anisotropic conductive member of the present invention and the forming methods thereof will be described.

[Insulating Base]

The insulating base constituting the anisotropic conductive member of the present invention is made of an inorganic material, and the inorganic material is not particularly limited as long as the material has electric resistivity (about $10^{14}$ Ω·cm), which is comparable to that of an insulating base constituting a known anisotropic conductive film.

The "made of an inorganic material" is a definition to distinguish the material of the insulating base from a polymer material constituting the pressure sensitive adhesive layer, which will be described later, and is not limited to an insulating base made of only an inorganic material but refers to an insulating base having an inorganic material as a main component (50% by mass or more).

Examples of the insulating base include a glass base, a ceramic base (for example, silicon carbide, and silicon nitride), a carbon base (for example, diamond-like carbon), a polyimide base, and a composite material of these, and the insulating base may be a material of a film of an inorganic material including 50% by mass or more of a ceramic material and a carbon material that is formed on an organic material having through holes.

In the present invention, the insulating base is preferably an anodized film of a valve metal for the reason that micropores having a desired average opening diameter are formed as through holes and thus conductive paths, which will be described later, are easily formed.

Here, specific examples of the valve metal include aluminum, tantalum, niobium, titanium, hafnium, zirconium, zinc, tungsten, bismuth, and antimony.

Among these, an anodized film (base) of aluminum is preferably used because aluminum has a good dimensional stability and is relatively inexpensive.

In the present invention, the thickness of the insulating base (a portion that is indicated by the reference numeral 6 in FIG. 5B) is preferably 1 μm to 1,000 μm, more preferably 5 μm to 500 μm, and still more preferably 10 μm to 300 μm. When the thickness of the insulating base is within the range, the handleability of the insulating base is good.

In the present invention, the width between the conductive paths (a portion that is indicated by the reference numeral 7 in FIG. 5B) in the insulating base is preferably 10 nm or more and more preferably 20 nm to 200 nm. When the width between the conductive paths in the insulating base is within the range, the insulating base sufficiently functions as an insulating partition wall.

[Conductive Path]

The plural conductive paths constituting the anisotropic conductive member of the present invention are made of a conductive material, penetrate the insulating base in the thickness direction thereof and provided in a mutually insulated state.

In addition, the conductive paths have protrusions which protrude from the surface of the insulating base and the end of the protrusion of each of the conductive paths is provided to be exposed or protrude from the surface of the pressure sensitive adhesive layer which will be described later.

<Conductive Material>

The conductive material constituting the conductive path is not particularly limited as long as the material used has an electric resistivity $10^3$ Ω·cm or less. Specifically, preferable examples thereof include gold (Au), silver (Ag), copper (Cu), aluminum (Al), magnesium (Mg), nickel (Ni), and tin oxide doped with indium (ITO).

Among these, from the viewpoint of electrical conductivity, copper, gold, aluminum and nickel are preferable and copper and gold are more preferable.

<Protrusion>

The protrusions of the conductive paths are portions of the conductive paths that protrude from the surface of the insulating base and the end of the protrusion is exposed or protrudes from the surface of the pressure sensitive adhesive layer.

Next, the shape of the protrusion of the conductive path will be described using FIGS. 5A to 6C.

Here, in the embodiment shown in FIG. 5B, the end of the protrusion 3a of the conductive path 3 protrudes from the surface of the pressure sensitive adhesive layer 4, and in all embodiments shown in FIGS. 6A to 6C, the end of the protrusion 3a of the conductive path 3 is exposed from the surface of the pressure sensitive adhesive layer 4. The embodiment in which the end of the protrusion is exposed is not limited to an embodiment in which the end (end surface) of the protrusion of the conductive path 3 and the surface of the pressure sensitive adhesive layer 4 constitute the same plane as shown in FIGS. 6A to 6C and may be an embodiment in which the end (end surface) of the protrusion of the conductive path 3 is disposed at a position closer to the insulating base 2 than to the surface of the pressure sensitive adhesive layer 4, in other words, an embodiment in which the end (end surface) of the protrusion is provided at a position recessed from the surface of the pressure sensitive adhesive layer 4.

In addition, the protrusion of the conductive path may have a columnar shape the same as (continuously formed with) the shape of the conductive path present in the insulating base 2 as shown in FIG. 6A but may have a columnar shape bent from the conductive path present in the insulating base 2 as shown in FIG. 6B. Further, an embodiment in which the protrusions 3a of the plural conductive paths come into contact with each other as shown in FIG. 6C may be adopted. In the embodiment shown in FIG. 6C, needless to say, an embodiment in which the protrusions of all conductive paths come into contact with each other is excluded in order to secure the function as conductive paths.

In the present invention, when the anisotropic conductive member and the electrode are connected (bonded) by a method such as compression bonding, for the reason that insulting properties in the in-plane direction in the case in which the protrusion is crushed can be sufficiently secured, the aspect ratio of the protrusion (height of protrusion/ diameter of protrusion) of the conductive path is preferably 0.01 or more and less than 20 and more preferably 6 to 20.

In addition, in the present invention, from the viewpoint of following the surface shape of a semiconductor element or a wiring substrate which is an object to be connected, the height of the protrusion of the conductive path is preferably 50 nm to 1,500 nm and more preferably 300 to 1,050 nm.

Similarly, the diameter of the protrusion of the conductive path is preferably more than 5 nm and 10 μm or less and more preferably 40 nm to 1,000 nm.

<Other Shapes>

The conductive path has a columnar shape and the diameter thereof (a portion that is indicated by the reference numeral 8 in FIG. 5B) is preferably more than 5 nm and 10 μm or less and more preferably 40 nm to 1,000 nm, similar to the diameter of the protrusion.

In addition, the conductive paths are presented in a state in which the conductive paths are insulated from each other by the insulating base. The density thereof is preferably 20,000 conductive paths/mm² or more, more preferably 2,000,000 conductive paths/mm² or more, still more preferably 10,000,000 conductive paths/mm² or more, particularly preferably 50,000,000 conductive paths/mm² or more, and most preferably 100,000,000 conductive paths/mm² or more.

Further, the center-to-center distance between adjacent each conductive path (a portion that is indicated by the reference numeral 9 in FIGS. 5A and 5B) is preferably 20 nm to 500 nm, more preferably 40 nm to 200 nm, and still more preferably 50 nm to 140 nm.

[Pressure Sensitive Adhesive Layer]

The pressure sensitive adhesive layer constituting the anisotropic conductive member of the present invention is a layer that is provided on the surface of the insulating base and contributes to bonding portions of the wiring substrate other than the electrodes.

In the present invention, for the reason that warping caused by different shrinkage after connection can be reduced, the pressure sensitive adhesive layer is preferably a layer containing a polymer material having a thermal expansion coefficient of less than $50 \times 10^{-6}$ $K^{-1}$ and more preferably a layer containing a polymer material having $5 \times 10^{-6}$ $K^{-1}$ to $30 \times 10^{-6}$ $K^{-1}$.

The reason why warping after connection can be reduced as described can be thought as follows. A difference in thermal expansion coefficient between the pressure sensitive adhesive layer and a semiconductor element or a wiring substrate which is an object to be connected is reduced and a film thickness to absorb a displacement difference is not required so that the thickness of the pressure sensitive adhesive layer can be reduced. As a result, the influence of the thermal expansion coefficient of the pressure sensitive adhesive layer itself can be reduced.

Here, the thermal expansion coefficient refers to a value obtained by measurement according to the "Testing method for linear thermal expansion coefficient of plastics by thermomechanical analysis" of JIS K 7197:1991 and in the case of using two or more polymer materials in combination, a value obtained by measuring a mixture of these polymer materials is used.

<Polymer Material>

The polymer material is not particularly limited and one or two or more polymer materials may be appropriately selected from known resin materials to have a thermal expansion coefficient of less than $50 \times 10^{-6}$ $K^{-1}$.

Among these, for the reasons that the gap between the wiring substrate and the anisotropic conductive member can be effectively filled and the adhesiveness with the wiring substrate is further increased, a polyimide resin (thermal expansion coefficient: $30 \times 10^{-6}$ $K^{-1}$ to $50 \times 10^{-6}$ $K^{-1}$) and/or an epoxy resin (thermal expansion coefficient: $45 \times 10^{-6}$ $K^{-1}$ to $65 \times 10^{-6}$ $K^{-1}$) is preferably used.

<Shape>

In the present invention, from the viewpoint of following the surface shape of a semiconductor element or a wiring substrate which is an object to be connected, the thickness of the pressure sensitive adhesive layer is preferably 50 nm to 1,500 nm and more preferably 250 nm to 1,000 nm.

In the present invention, as described above, the end of the protrusion of the conductive path is exposed or protrude from the surface of the pressure sensitive adhesive layer. However, for the reason that the connection resistance between the anisotropic conductive member and the electrode can be further reduced, the absolute value of a difference between the height of the protrusion of the conductive path and the thickness of the pressure sensitive adhesive layer is preferably 0 nm to 50 nm. A state in which the absolute value of a difference between the height of the protrusion of the conductive path and the thickness of the pressure sensitive adhesive layer is 0 nm is a state in which the end of the protrusion of the conductive path is exposed from the surface of the pressure sensitive adhesive layer on the same plane.

The reason why the connection resistance can be reduced as described above can be thought that by controlling the absolute value of the thickness difference to be within the above-described range, even in a state in which the shape of the pressure sensitive adhesive layer is changed, the connection between the electrode and the conductive path is hardly disturbed.

[Peeling Film]

Figure 7:
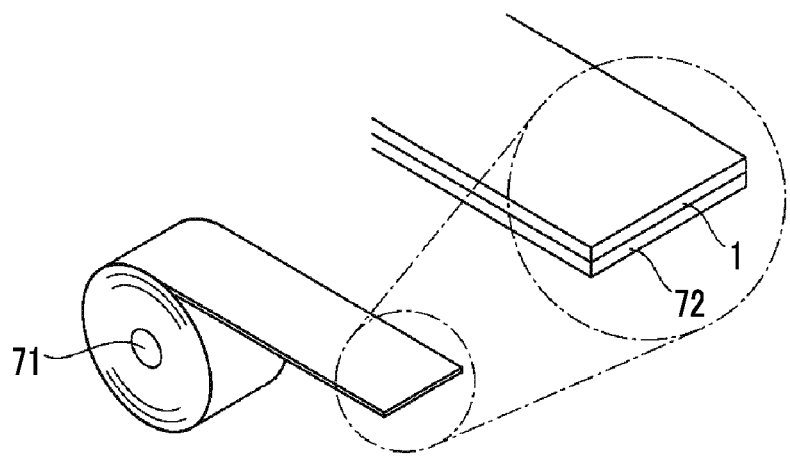
FIG. 7 is a schematic view illustrating an example of a supply form of the anisotropic conductive member of the present invention.

Since the anisotropic conductive member of the present invention is supplied in the form in which an anisotropic conductive member is wound around a winding core 71 having predetermined diameter and width as shown in FIG. 7, a peeling film (a portion that is indicated by the reference numeral 72 in FIG. 7) is preferably provided on one surface of anisotropic conductive member.

Here, as the peeling film, for example, a polyester-based, polypropylene-based, polyethylene-based, or polytetrafluoroethylene-based cast film; a film obtained by applying a silicone resin to a stretching film and subjecting the film to a peeling treatment; release paper; and the like may be used.

In the anisotropic conductive member of the present invention including the above-described insulating base, conductive paths and pressure sensitive adhesive layer, the thickness as a transport conductive member, that is, a total value of the thickness of the insulating base and the largest value between the height of the protrusion of the conductive path and the thickness of the pressure sensitive adhesive layer (including the thickness of the peeling film in the case in which the peeling film is provided) is preferably 50 µm or less and more preferably 10 µm to 50 µm.

[Method of Producing Anisotropic Conductive Member]

The method of producing the anisotropic conductive member of the present invention is not particularly limited (hereinafter, also formally referred to as the "production method of the present invention"). For example, the production method includes a conductive path forming step of forming the conductive paths by filling the through holes provided in the insulating base with the conductive material, a trimming step of removing only a part of the surface of the insulating base after the conductive path forming step and causing the conductive paths to protrude, and a pressure sensitive adhesive layer forming step of forming a pressure sensitive adhesive layer only on the surface of the insulating base after the trimming step.

[Preparation of Insulating Base]

For the insulating base, for example, a glass substrate having through holes (Through Glass Via: TGV) can be used as it is. However, from the viewpoint of controlling the opening diameter of the conductive path and the aspect ratio of the protrusion to be within the above-described ranges, a method of subjecting a valve metal to an anodizing treatment is preferable.

As the anodizing treatment, for example, in the case in which the insulating base is an anodized film of aluminum, an anodizing treatment of anodizing an aluminum substrate is carried out and then a perforating treatment of perforating the substrate to form holes of micropores formed by the anodization after the anodizing treatment is carried out sequentially to prepare an insulating base.

In the present invention, regarding the aluminum substrate used for the preparation of the insulating base and each of the treatment steps to be carried out on the aluminum substrate, the same aluminum substrates and treatment steps as in the description of paragraphs [0041] to [0121] of JP2008-270158A can be adopted.

[Conductive Path Forming Step]

The conductive path forming step is a step of filling the through holes that are provided in the insulating base with the conductive material.

Here, as the method of filling the through holes with the conductive material, for example, the same methods as each method described in paragraphs [0123] to [0126] and [FIG. 4] of JP2008-270158A (an electroplating method or an electroless plating method).

In an electroplating method or an electroless plating method, it is preferable to provide an electrode layer of gold, nickel, copper or the like in advance. As the method of forming the electrode layer, for example, a vapor phase treatment such as sputtering; a liquid layer treatment such as electroless plating; and a combination of these treatments may be used.

Through the metal filling step, an anisotropic conductive member before the protrusions of the conductive paths are formed is obtained.

On the other hand, instead of using the methods described in JP2008-270158A, for example, the conductive path forming step may be a method having steps of an anodizing treatment step of forming an anodized film having micropores present in the thickness direction and a barrier layer present at the bottom of the micropores on one surface of an aluminum substrate by subjecting one surface of the aluminum substrate (hereinafter, also referred to as "one surface") to an anodizing treatment, a barrier layer removal step of removing the barrier layer of the anodized film after the anodizing treatment step, a metal filling step of filling the micropores with a metal by subjecting the anodized film to an electroplating treatment after the barrier layer removal step, and a substrate removal step of obtaining a metal filled microstructure by removing the aluminum substrate after the metal filling step.

<Anodizing Treatment Step>

The anodizing step is a step of forming an anodized film having micropores present in the thickness direction and a barrier layer present at the bottom of the micropores on one surface of the aluminum substrate by subjecting one surface of the aluminum substrate to an anodizing treatment.

In the production method of the present invention, the anodizing treatment can be carried out using known methods but from the viewpoint of increasing regularity of micropore arrangement and securing anisotropic conductivity, a self-regulation method and a constant voltage treatment are preferably used.

Here, regarding the self-regulation method and the constant voltage treatment of the anodizing treatment, the same treatments as each of the treatments described in paragraphs [0056] to [0108] and [FIG. 3] of JP2008-270158A can be carried out.

<Barrier Layer Removal Step>

The barrier layer removal step is a step of removing the barrier layer of the anodizing treatment after the anodizing treatment step. By removing the barrier layer, a part of the aluminum substrate is exposed through the micropores.

The method of removing the barrier layer is not particularly limited and examples thereof include a method of electrochemically dissolving the barrier layer at a potential lower than the potential in the anodizing treatment of the anodizing treatment step (hereinafter, also referred to as an "electrolytic removal treatment"); a method of removing the barrier layer by etching (hereinafter, also referred to as an "etching removal treatment"); and a method of combining these methods (particularly, a method of removing the barrier layer remaining after the electrolytic removal treatment is carried out by the etching removal treatment).

<Electrolytic Removal Treatment>

The electrolytic removal treatment is not particularly limited as long as the electrolytic treatment is carried out at a potential lower than the potential in the anodizing treatment of the anodizing treatment step (electrolytic potential).

In the present invention, the electrolytic removal treatment may be carried out continuously with the anodizing treatment by, for example, dropping the electrolytic potential when the anodizing treatment step is completed.

For the conditions for the electrolytic removal treatment other than electrolytic potential, the same electrolytic solutions and treatment conditions as in the above-described known anodizing treatments can be adopted.

Particularly, in the case in which the electrolytic removal treatment and the anodizing treatment are continuously carried out as described above, it is preferable to carry out the treatments using the same electrolytic solution.

(Electrolytic Potential)

The electrolytic potential in the electrolytic removal treatment is preferably dropped to a potential lower than the electrolytic potential in the anodizing treatment continuously or stepwise.

The reduction range (step width) when the electrolytic potential is dropped stepwise is preferably 10 V or less, more preferably 5 V or less, and still more preferably 2 V or less from the viewpoint of the voltage resistance of the barrier layer.

In addition, the voltage dropping rate when the electrolytic potential is dropped continuously or stepwise is preferably 1 V/sec or less, more preferably 0.5 V/sec or less, and still more preferably 0.2 V/sec or less from the viewpoint of productivity.

<Etching Removal Treatment>

The etching removal treatment is not particularly limited and may be a chemical etching treatment for dissolution using an aqueous acid solution or an aqueous alkaline solution or may be a dry etching treatment.

(Chemical Etching Treatment)

The barrier layer by the chemical etching treatment may be removed by, for example, a method of immersing the structure after the anodizing treatment step in an aqueous acid solution or an aqueous alkaline solution, filling the micropores with the aqueous acid solution or the aqueous alkaline solution, and then bringing the surface of the anodized film on the opening side of the micropores into contact with a pH buffer solution or the like and only the barrier layer can be selectively dissolved.

Here, in the case of carrying out the treatment using an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1% to 10% by mass. The temperature of the aqueous acid solution is preferably 15° C. to 80° C., more preferably 20° C. to 60° C., and still more preferably 30° C. to 50° C.

On the other hand, in the case of carrying out the treatment using an aqueous alkaline solution, it is preferable to use an aqueous solution of at least one alkali selected from the group consisting of sodium hydroxide, potassium hydroxide and lithium hydroxide. In addition, the aqueous alkaline solution preferably has a concentration of 0.1% to 5% by mass. The temperature of the aqueous alkaline solution is preferably 10° C. to 60° C., more preferably 15° C. to 45° C., and still more preferably 20° C. to 35° C. The aqueous alkaline solution may contain zinc and other metals.

Specifically, for example, a 40° C. aqueous solution containing 50 g/L of phosphoric acid, a 30° C. aqueous solution containing 0.5 g/L of sodium hydroxide, a 30° C. aqueous solution containing 0.5 g/L of potassium hydroxide, or the like is suitably used.

As the pH buffer solution, a buffer solution suitable to the aqueous acid solution or aqueous alkaline solution can be suitable used.

In addition, the time of immersion in the aqueous acid solution or aqueous alkaline solution is preferably 8 to 120 minutes, more preferably 10 to 90 minutes, and still more preferably 15 to 60 minutes.

(Dry Etching Treatment)

In the dry etching treatment, it is preferable to use, for example, a gas such as a $Cl_2$/Ar mixed gas.

<Metal Filling Step>

The metal filling step is a step of filling the micropores in the anodized film, which has been subjected to an electroplating treatment, with a metal after the barrier removal step, and examples thereof include the same methods as each method described in paragraphs [0123] to [0126] and [FIG. 4] of JP2008-270158A (an electroplating method or an electroless plating method).

In the electroplating method or the electroless plating method, the aluminum substrate that is exposed through the micropores after the above-described barrier layer removal step can be used as an electrode.

<Substrate Removal Step>

The substrate removal step is a step of obtaining a metal filled microstructure by removing the aluminum substrate after the metal filling step.

As the method of removing the aluminum substrate, for example, a method of dissolving only the aluminum substrate using a treatment liquid without dissolving the metal filling the micropores in the metal filling step and the anodized film as the insulating base.

Examples of the treatment liquid include aqueous solutions such as mercury chloride, a bromine/methanol mixture, a bromine/ethanol mixture, aqua regia, and a hydrochloric acid/copper chloride mixture. Among these, the treatment liquid is preferably a hydrochloric acid/copper chloride mixture.

In addition, the concentration of the treatment liquid is preferably 0.01 to 10 mol/L and more preferably 0.05 to 5 mol/L.

The temperature of the treatment liquid is preferably −10° C. to 80° C. and more preferably 0° C. to 60° C.

[Trimming Step]

The trimming step is a step of removing only a part of the insulating base on the surface of the anisotropic conductive member after the conductive path forming step and causing the conductive paths to protrude.

Here, the trimming treatment is not particularly limited as long as the metal constituting the conductive paths is not dissolved, and for example, in the case of carrying out the treatment using an aqueous acid solution, it is preferable to use an aqueous solution of an inorganic acid such as sulfuric acid, phosphoric acid, nitric acid or hydrochloric acid, or a mixture thereof. Among these, it is preferable to use an aqueous solution not containing chromic acid from the viewpoint of excellent safety. The aqueous acid solution preferably has a concentration of 1% to 10% by mass. The temperature of the aqueous acid solution is preferably 25° C. to 60° C.

On the other hand, in the case of carrying out the treatment using an aqueous alkaline solution, it is preferable to use an aqueous solution of at least one alkali selected from the group consisting of sodium hydroxide, potassium hydroxide and lithium hydroxide. The aqueous alkaline solution preferably has a concentration of 0.1% to 5% by mass. The temperature of the aqueous alkaline solution is preferably 20° C. to 50° C.

Specifically, for example, a 40° C. aqueous solution containing 50 g/L of phosphoric acid, a 30° C. aqueous solution containing 0.5 g/L of sodium hydroxide, or a 30° C. aqueous solution containing 0.5 g/L of potassium hydroxide is suitably used.

The time of immersion in the aqueous acid solution or aqueous alkaline solution is preferably 8 to 120 minutes, more preferably 10 to 90 minutes, and still more preferably 15 to 60 minutes. Here, in the case of repeating an immersion treatment for a short period of time (trimming treatment), the time of immersion is a total of each time of immersion. Incidentally, a washing treatment may be carried out between each immersion treatment.

In the production method of the present invention, in the case of strictly controlling the height of the protrusions of the conductive paths in the trimming step, it is preferable to process the insulating base and the ends of the conductive paths to form the same plane after the conductive path forming step, and then selectively remove (trim) the insulating base.

Here, for example, the method of processing to form the same plane include physical polishing (for example, free abrasive polishing, back grinding, polishing using a surface planer, or the like), electrochemical polishing, polishing of combining these polishing processes, and the like.

In addition, in the production method of the present invention, after the above-described conductive path forming step or trimming step, a heating treatment can be carried out in order to reduce the strain generated in the conductive paths by the filling of the metal.

It is preferable to carry out a heating treatment in a reducing atmosphere from the viewpoint of preventing oxidation of the metal. Specifically, a heating treatment is preferably carried out at an oxygen concentration of 20 Pa or less and more preferably carried out in vacuum. The term "vacuum" used herein refers to a state of a space with a gas density or pressure lower than the gas density or pressure of air.

In addition, it is preferable to carry out a heating treatment while applying pressure to a material for the purpose of correction.

[Pressure Sensitive Adhesive Layer Forming Step]

The pressure sensitive adhesive layer forming step is a step of forming a pressure sensitive adhesive layer only on the surface of the insulating base after the trimming step.

Here, as the method of forming the pressure sensitive adhesive layer, for example, a method of applying a resin composition containing a polymer material having the above-described thermal expansion coefficient and a solvent (for example, methyl ethyl ketone or the like) to the surface of the insulating base and drying the resin composition, and baking the resin composition if required may be used.

The method of applying the resin composition is not particularly limited and for example, known coating methods such as a gravure coating method, a reverse coating method, a die coating method, and coating using a blade coater, a roll coater, an air knife coater, a screen coater, a bar coater, and a curtain coater can be used.

In addition, the drying method after coating is not particularly limited and for example, a treatment of carrying out heating at a temperature of 30° C. to 80° C. for several seconds to several minutes and a treatment of carrying out heating at a temperature of 50° C. to 200° C. under a reduced pressure may be carried out.

The baking method after drying is not particularly limited because the baking method differs depending on a polymer material to be used. In the case of using a polyimide resin, for example, a treatment of carrying out heating at a temperature of 160° C. to 240° C. for 2 minutes to 1 hour or the like may be used. In the case of using an epoxy resin, for example, a treatment of carrying out heating at a temperature of 30° C. to 80° C. for 2 to 60 minutes or the like may be used.

In the production method of the present invention, each of the above-described steps can be carried out on each sheet and can be continuously carried out on a web obtained by using a coil of aluminum as a raw sheet.

In addition, in the case of continuously carrying out these steps, it is preferable to provide appropriate washing step and drying step between each of the steps.

[Multilayer Wiring Substrate]

Hereinafter, the multilayer wiring substrate of the present invention will be described in detail.

The multilayer wiring substrate of the present invention is a multilayer wiring substrate in which the above-described anisotropic conductive member of the present invention and a wiring substrate which is electrically connected to the conductive material (conductive paths) present in the through holes of the anisotropic conductive member via an electrode are laminated.

Next, the configuration of the multilayer wiring substrate of the present invention will be described with FIG. 8.

Figure 8:
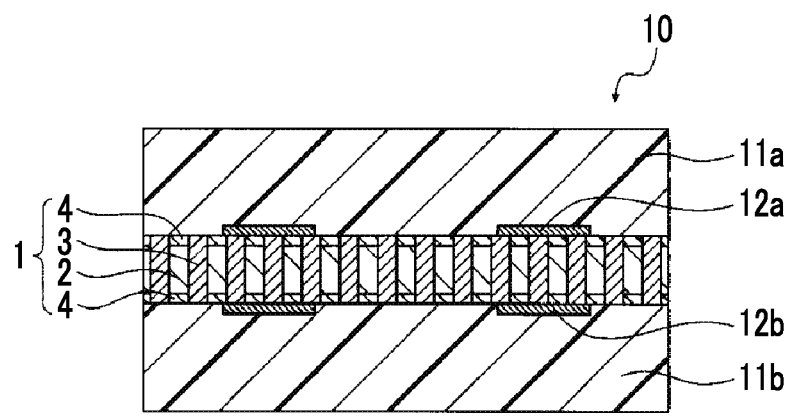
FIG. 8 is a schematic cross-sectional view showing an example of a preferable embodiment of a multilayer wiring substrate of the present invention.

In a multilayer wiring substrate 10 shown in FIG. 8, since the conductive paths 3 are bonded with the electrodes 12*a* and 12*b* in wiring substrates 11*a* and 11*b* and the pressure sensitive adhesive layer 4 that is provided on the surface of the insulating base 2 comes into contact with portions of the wiring substrates 11*a* and 11*b* other than the electrodes 12*a* and 12*b*, the adhesiveness with the wiring substrates increases and excellent conduction reliability can be achieved. The anisotropic conductive member shown in FIG. 8 adopts an embodiment in which the ends (end surfaces) of the protrusions of the conductive paths and the surface of the pressure sensitive adhesive layer form the same plane as in FIG. 6A, but as shown in FIG. 5B, in an embodiment in which the ends (end surfaces) of the protrusions of the conductive paths protrude from the surface of the pressure sensitive adhesive layer, the pressure sensitive adhesive layer 4 that is provided on the surface of the insulating base 2 comes into contact with portions of the wiring substrates 11*a* and 11*b* other than the electrodes 12*a* and 12*b* with a polymer material that expands due to heat by performing thermocompression bonding on the wiring substrates.

In the present invention, when the above-described anisotropic conductive member of the present invention and the wiring substrate are bonded or connected (hereinafter, also simply referred to as "bonded or the like"), if required, a removal treatment of removing an oxide film that can be formed at the ends (end surfaces) of the protrusions of the conductive paths in the anisotropic conductive member, organic contamination, or the like, and an activation treatment of activating the ends (end surfaces) of the protrusions of the conductive paths in the anisotropic conductive member or the surface of the pressure sensitive adhesive layer can be carried out.

[Removal Treatment]

For the method of removing the oxide film, for example, chemical treatments such as a formic acid treatment of removing an oxide film utilizing the reducing action of a formic acid gas, and a dissolving treatment of immersing an oxide film in an acidic liquid such as sulfuric acid to dissolve the surface of the oxide film may be used.

In addition, an ion beam treatment of irradiating the surface of an oxide film with an ion beam or a neutral atom beam in a high vacuum, a plasma treatment of sealing a substrate in a plasma atmosphere and then applying a bias, and a method of physically removing an oxide film by carrying out reactive ion etching (RIE) or the like may also be used. An inert argon element or the like is used as an ion source or a plasma source.

In addition, as the method of removing organic contamination, a treatment of irradiating organic materials with vacuum ultraviolet light under the presence of oxygen gas (vacuum ultraviolet irradiation treatment in the presence of oxygen gas (VUV/O3)) is also effective. By carrying out irradiation with vacuum ultraviolet light having a wavelength of 175 nm or less, oxygen radical having oxygen or ozone as a starting material is formed and the oxygen radical makes organic materials dissolve or volatilize so that a reduction of surface contamination can be facilitated. A nitrogen gas can be used according to the target substrate material.

[Activation Treatment]

For the activation treatment, a method of exposing an active surface by removing the oxide film, organic contamination, or the like using physical energy similar to the above-described removal treatment, or changing the bonding state of the surface of the pressure sensitive adhesive layer may be used.

In addition, for the activation treatment, a method of exposing a film to water vapor can be adopted in order to form a surface of a thin film having a function of bonding or the like (bonding layer). Functional groups (for example, a hydroxyl group) resulting from water molecules adhering to the surface contribute to condensation, and thus mutual bonding of metal, oxides, and organic materials can be realized. The thickness of the bonding layer that is formed by such a method is as thin as ten several nanometers, and an influence on the electrical characteristics is very small.

Further, in the activation treatment, it is useful to form an oxygen adsorbing layer on the outermost surface layer of the metal (for example, copper) constituting the ends (end surfaces) of the protrusions of the conductive paths. A very thin oxygen adsorbing layer is formed on the end surface of the protrusion of each of the conductive paths by exposing the anisotropic conductive member of the present invention to a humidity controlled environment, and then bonding or the like is carried out. Since the oxygen adsorbing layer is very thin and copper atoms easily spread, the properties of the almost metallic copper in electrical are exhibited at the time of completion of bonding.

In addition, a layer including a catalyst component or reducing material may be formed on the surface of the end of the protrusion. As the catalyst component, known metal catalysts can be used and for example, platinum (Pt), palladium (Pd), and the like can be used. In addition, as the reducing material, for example, compounds containing a hydroxyl group can be used. It is preferable to use a compound having three or more hydroxyl groups and specifically, polyhydric alcohol such as trimethylolpropane can be suitably used.

In the case in which each of the above-described treatments is incorporated in a bonding apparatus or connecting apparatus (hereinafter, abbreviated as an "apparatus for bonding or the like"), each of the treatments can be continuously carried out in a chamber in the apparatus for bonding or the like.

In addition, in the case in which each of the treatments is not incorporated in the apparatus for bonding or the like, the treatments are carried out outside a chamber and then the treated anisotropic conductive member and the wiring substrate are quickly connected. Then, the same effect can be obtained.

For the apparatus for bonding or the like, apparatuses based on various principles are put into practical use and the apparatuses are roughly divided into a permanent bonding apparatus for permanently bonding silicon wafers and a temporary bonding apparatus for temporarily bonding silicon wafers. Any apparatus may be used as long as pressurizing capability, heating temperature, and connection environments are satisfied.

Figure 9:
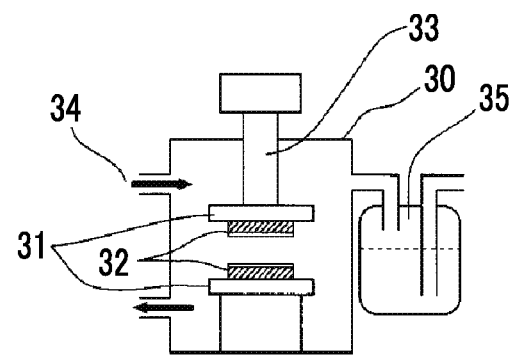
FIG. 9 is a schematic cross-sectional view showing an example of a bonding apparatus used for production of the multilayer wiring substrate of the present invention.
Figure 10A:
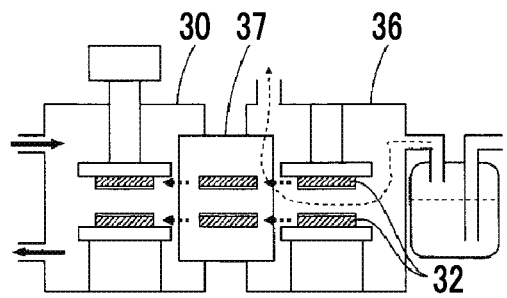
FIGS. 10A to 10C are schematic cross-sectional views respectively showing examples of a bonding apparatus used for production of the multilayer wiring substrate of the present invention.
Figure 10B:
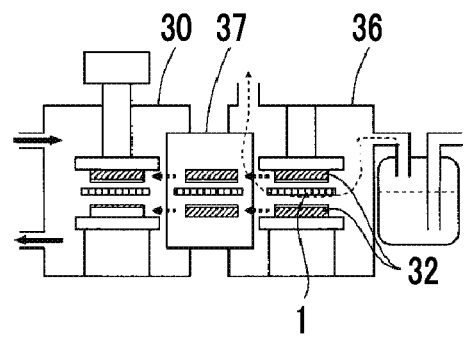
Figure 10C:
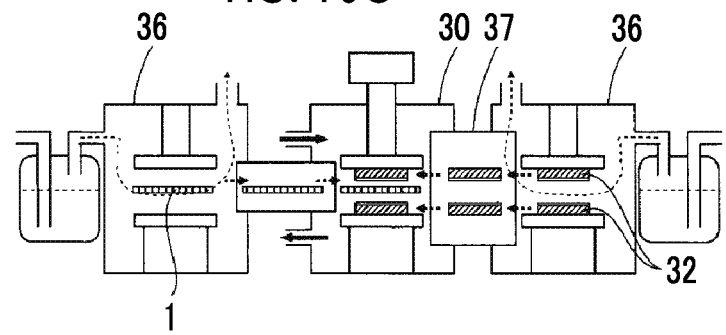
Figure 11:
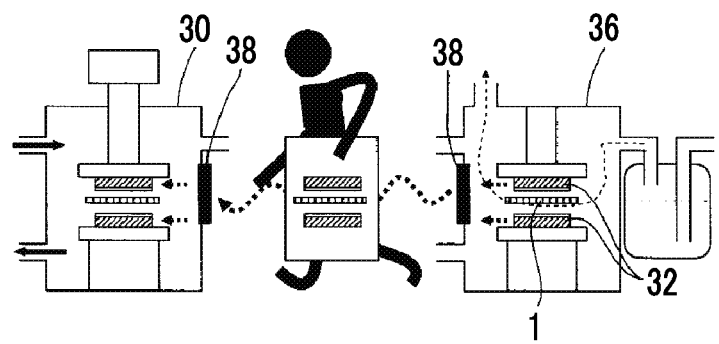
FIG. 11 is a schematic cross-sectional view showing an example of a bonding apparatus used for production of the multilayer wiring substrate of the present invention.

Further, examples of the apparatus for bonding or the like include embodiments shown in FIGS. 9 to 11. Here, the embodiment shown in FIG. 9 (reference numeral 30: bonding chamber, reference numeral 31: substrate holder with heating mechanism, reference numeral 32: target member, reference numeral 33: moving mechanism, reference numeral 34: flow mechanism, and reference numeral 35: treatment gas introduction mechanism) is of a type in which the removal treatment and the activation treatment can be carried out in the bonding chamber 30. The embodiments shown in FIGS. 10A to 10C are embodiments in which a treatment chamber 36 is prepared separate from the bonding chamber 30 and both chambers are connected via a load lock mechanism 37. The embodiment shown in FIG. 11 (reference numeral 38: chamber door) shows an embodiment in which target members are treated in the treatment chamber 36 and then moved to the bonding chamber 30.

In any of these embodiments, members to be boned (target members) and the anisotropic conductive member of the present invention are arranged in a state in which the member to be boned and the anisotropic conductive member of the present invention are separated from each other and the above-described removal treatment and activation treatment can be carried out in this state.

Specifically, as shown in FIG. 9, the target members and the anisotropic conductive member of the present invention may be bonded by carrying out the removal treatment and the activation treatment in advance, and then introducing the anisotropic conductive member between the target members 32, which are arranged to be separated from each other, to be bonded. In the same manner, as shown in FIG. 10A, the target members and the anisotropic conductive member of the present invention may be bonded by carrying out the removal treatment and the activation treatment in the treatment chamber 36, moving the target members 32, which are arranged to be separated from each other, to the bonding chamber 30, and then introducing the anisotropic conductive member of the present invention between the target members, which are arranged to be separated from each other, to be bonded. In the embodiments shown in FIGS. 9 and 10A, one of the target members 32 may be the anisotropic conductive member of the present invention.

In addition, in the case of collectively bonding plural target members or the like, the target members and the anisotropic conductive member of the present invention can be bonded by carrying out the above-described removal treatment and activation treatment in a state in which the anisotropic conductive member of the present invention is arranged between the target members, which are arranged to be separated from each other, and bonding the members in this state or the like. Specifically, as shown in FIG. 10B, the target members and the anisotropic conductive member of the present invention can be bonded by carrying out the above-described removal treatment and activation treatment in the treatment chamber 36 in a state in which the anisotropic conductive member 1 of the present invention is arranged between the target members 32, which are arranged to be separated from each other, and then moving the members to the bonding chamber 30 to be bonded or the like.

In addition, the target members and the anisotropic conductive member of the present invention may be bonded by preparing only the anisotropic conductive member of the present invention in a separate room, subjecting the anisotropic conductive member to the removal treatment and the activation treatment in advance, and introducing the anisotropic conductive member between the target members, which are arranged to be separated from each other, to be bonded. At this time, the anisotropic conductive member may not be subjected to the removal treatment and the activation treatment or may be subjected to the removal treatment and the activation treatment in the separate room. In addition, the separate room and the bonding chamber may be connected to each other or the anisotropic conductive member may be quickly introduced in the bonding chamber after being subjected to the treatments in the separate room. Specifically, for example, as shown in FIG. 10C, the target members and the anisotropic conductive member of the present invention may be bonded by subjecting only the anisotropic conductive member 1 of the present invention to the removal treatment and the activation treatment in the treatment chamber 36, subjecting the target members 32, which are arranged to be separated from each other, to the removal treatment and the activation treatment in a separate treatment chamber 36, moving these members to the bonding chamber 30, and introducing the anisotropic conductive member of the present invention between the target members, which are arranged to be separated from each other, to be bonded. In the case in which the removal treatment and the activation treatment to be performed on the target members are not required, the treatment chamber 36 on the right side in FIG. 10C is not required. In addition, in the case in which only the target members are subjected to the removal treatment and the activation treatment and the anisotropic conductive member of the present invention is not subjected to the removal treatment and the activation treatment, the treatment chamber 36 on the left side in FIG. 10C has a mechanism simply functioning as a load lock.

The atmosphere in the treatment chamber where the removal treatment and the activation treatment are carried out may be static or may have a flow of gas or the like. Particularly, since the surface of the anisotropic conductive member of the present invention has a minute shape and has a large surface area, uniformity in treatment is improved in a flow state. The flow direction may be parallel to the surface or may be a blowing direction.

In the case of using an ion beam or the like, it is difficult to arrange the anisotropic conductive member of the present invention between the target members and thus it is desirable to carry out a separate treatment to arrange the anisotropic conductive member between the target members.

Examples of a representative apparatus for bonding or the like, which are commercially available, include apparatuses manufactured by Mitsubishi Heavy Industries, Ltd., Ayumi Industry Co. Ltd., Musashino Co. Ltd., SUSS micro Tec AG., Bond-Tech Co. Ltd., Tokyo Electron Limited, Toray Engineering Co. Ltd., EV Group, and PMT Corporation.

As the wiring substrate which is a target member, a rewiring layer that is formed on the silicon wafer can be certainly used and various substrates having a metal post (copper, gold), a metal bump, and the like can be applied. Examples of those will be shown in FIGS. 12A to 12D.

Figure 12A:
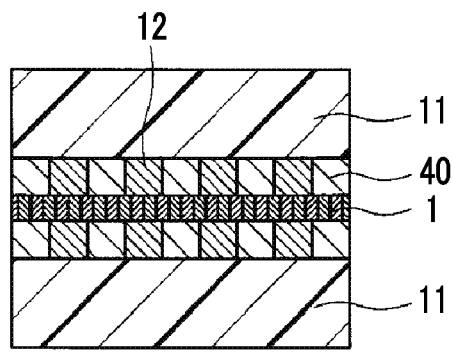
FIGS. 12A to 12D are schematic cross-sectional views respectively showing examples of preferable embodiments of the multilayer wiring substrate of the present invention.

As shown in FIG. 12A, the wiring substrates 11 (for example, IC device) having the electrodes 12 (for example, microbumps) may be bonded using the anisotropic conductive member 1 and a gap filling agent 40 may be injected into the gap therebetween as in the related art.

Figure 12B:
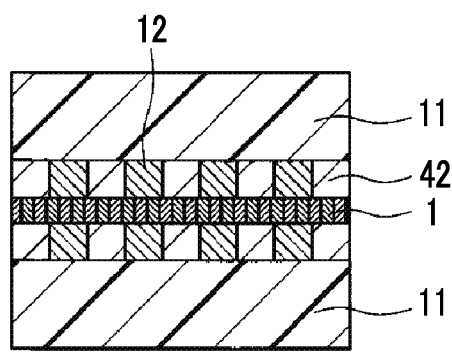

In addition, as shown in FIG. 12B, a substrate in which electrodes 12 and an insulating layer 42 (for example, passivation layer) are formed in the same plane can be applied. Here, the insulating layer may be formed of an inorganic material such as SiO/SiN, or may be formed of an organic material such as a polyimide resin, an epoxy resin, or a silicone resin. Further, a structure, in which the electrodes and the insulating layer are formed in the same plane as described above, can be prepared in such a manner that a space between posts in a chip in which metal electrodes are formed or typical electrode posts are formed in pattern-formed openings using a photosensitive resin is filled with a resin material by application or lamination and then the resin is removed only at the upper portions of the electrodes. For the organic material of the insulating layer (particularly, resin material), other than the above-described polyimide resin or the like, a film-like material such as a non conductive film (NFC) may be laminated. In addition, the resin layer at the upper portions of the electrodes can be removed by grinding, physically ground using an apparatus called a surface planer, or removed with an ion beam.

Figure 12C:
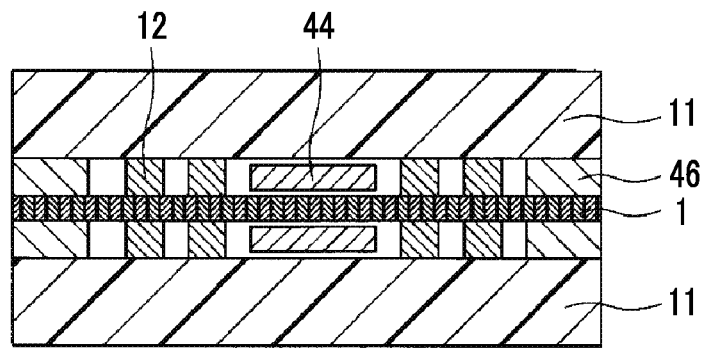

As shown in FIG. 12C, a substrate having a sealing portion 46 (for example, metal pad) having the same height as the height of the electrode provided in the vicinity of the substrate, separate from the electrodes 12, may be used. Such a substrate may be used for sealing a micro electro mechanical system (MEMS) device 44.

Figure 12D:
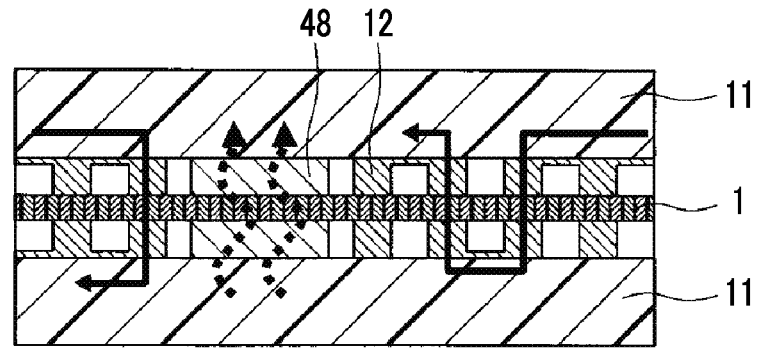

As shown in FIG. 12D, when a substrate having a heat dissipation constructive electrode 48 having the same height as the height of the electrode in addition to the electrode 12 in which a signal flows in the direction of an arrow is used, a device exhibiting high heat dissipation can be formed.

In the present invention, the connection between the above-described anisotropic conductive member of the present invention and the wiring substrate is not particularly limited and known methods can be appropriately adopted. For example, the connection may be carried out by thermocompression bonding using a wafer bonder and a flip chip bonder.

The atmosphere at the time of connection by thermocompression bonding may be any of vacuum, nitrogen atmosphere, and air, and a condition that the oxygen concentration in the chamber is 10 ppm or less is preferable.

In addition, the heating temperature at the time of thermocompression bonding is preferably 200° C. or higher, more preferably 250° C. or higher, and still more preferably 300° C. or higher.

The heating pressure the time of thermocompression bonding is preferably 1 MPa or more and 20 MPa or less, more preferably 10 MPa or less, and still more preferably 5 MPa or less.

The time of thermocompression bonding is preferably short but in the case of controlling the atmosphere, is desirably 30 minutes or less. In the case of using a flip chip bonder or the like, the time of thermocompression bonding is preferably 1 minute or less and particularly preferably 10 seconds or less.

In addition, when the anisotropic conductive member is fixed with a flip chip bonder and then kept in a heating atmosphere, the connection strength can be improved and stabilized.

Further, the anisotropic conductive member may be temporarily fixed on the wafer by utilizing the pressure sensitive adhesive layer that is provided on the surface of the insulating base of the anisotropic conductive member and then thermocompression bonding may be carried out using a wafer bonder.

When such methods are used, only non-defective members are arranged in non-defective portions on the wafer and thus a decrease in yield can be prevented.

The multilayer wiring substrate of the present invention can be suitably used as an interposer of a semiconductor package.

EXAMPLES

Hereinafter, the present invention will be described specifically with reference to the following examples. However, the present invention is not limited thereto.

Example 1

A photomask was closely attached to a commercial photosensitive glass substrate (trade name: PEG3 manufactured by HOYA Corporation: having a size of 5-inch square and a plate thickness of 0.65 mm) and then laminate was irradiated with ultraviolet rays. The conditions for irradiation were such that the wavelength was 320 nm and the exposure amount was 550 mJ/cm$^2$. In addition, for the mask pattern, a mask pattern in which total 90,000 circle patterns each having a diameter of 1 µm were arranged at a pitch of 300 µm in the horizontal and vertical directions was used.

After the laminate was irradiated with ultraviolet rays, a heating treatment was carried out in a heating furnace at 550° C. for 1 hour.

Then, the surface and the rear surface of the photosensitive glass substrate were ground by a double-side surface grinding machine using abrasive particles made of $Al_2O_3$ and having a particle size of #1,000, and further subjected to finishing polishing by a double-side polishing machine using cerium oxide abrasive particles. The plate thickness of the photosensitive glass substrate subjected to the finishing polishing was 0.3 mm and a total machining allowance of the surface and the rear surface was 0.35 mm.

Next, a photosensitive polyimide resin or epoxy resin composition, which will be described later, was applied to have a film thickness of 2 µm and exposure development was carried out using the same mask pattern such that the position of the circle pattern overlapped with the position of the above circle pattern.

Then, the exposed portions of the photosensitive glass substrate were dissolved and removed using an acid mixed etching solution obtained by adding sulfuric acid to a 7 vol % aqueous hydrofluoric acid solution (sulfuric acid concentration: 20 wt %).

Next, a copper electrode was closely attached to one surface of the glass substrate and electroplating was carried out using the copper electrode as a cathode and using platinum as a positive electrode.

A mixed solution of copper sulfate/sulfuric acid/hydrochloric acid=200/50/15 (g/L) in a state in which the mixed solution is kept at 25° C. was used as an electrolyte and constant voltage pulse electrolysis was carried out. Thus, a structure having through holes filled with copper (anisotropic conductive member precursor) was prepared.

Here, the constant voltage pulse electrolysis was carried out in such a manner that cyclic voltammetry was carried out in the plating solution using a plating apparatus manufactured by Yamamoto-MS Co., Ltd. and a powder supply (HZ-3000) manufactured by Hokuto Denko Corp. to confirm the deposition potential, and then the potential of the copper electrode closely attached to the glass was set to −2 V. In addition, the pulse waveform of the constant voltage pulse electrolysis was a rectangular wave. Specifically, the time for one electrolytic treatment was set to 60 seconds so that the total time of electrolytic treatment is 300 seconds and the pause time between each electrolytic treatment was set to 40 seconds. The electrolytic treatment was carried out 5 times.

When the surface after the though holes were filled with copper was observed with a field emission scanning electron microscope (FE-SEM), the copper partially overflowed from the surface of the pressure sensitive adhesive layer.

Thereafter, the surface was polished in the above-described manner and then a pressure sensitive adhesive layer was formed by thermally curing a polyimide resin by carrying out a heat treatment at 250° C. and heating and drying an epoxy resin at 80° C. Thus, an anisotropic conductive member was prepared. The pressure sensitive adhesive layer was selectively removed or shrunk by polishing, thermal curing, or heating and the thickness of the pressure sensitive adhesive layer was smaller than the height of the copper conductive paths as shown in Table 1 below.

(Polyimide Resin)

As the polyimide resin, a photosensitive polyimide resin (alkaline development positive photosensitive polyimide: PIMEL AM-200 Series, manufactured by Asahi Kasei E-Materials Co., Ltd.) was used.

(Epoxy Resin Composition)

10 parts of bisphenol A type epoxy resin having an epoxy equivalent of 250 g/eq, as a low epoxy equivalent epoxy resin, 90 parts of bisphenol F type phenoxy resin having an epoxy equivalent of 8,690 g/eq, as a high epoxy equivalent epoxy resin, and 9 parts of 4,4-bis[di(β-hydroxyethoxy)phenylsulfonio]phenylsulfide-bis (hexafluoroantimonate) as a photoacid generator were dissolved in dioxane to prepare a photosensitive epoxy resin adhesive composition having a solid content concentration of 50%.

The prepared anisotropic conductive member was observed with a field emission scanning electron microscope (FE-SEM).

As a result, as shown in Table 1 below, it was confirmed that the height of the protrusion of the conductive path is 1,050 nm, the diameter of the protrusion of the conductive path is 1,000 nm, the aspect ratio (height of protrusion/diameter of protrusion) is 1.05, and the thickness of the pressure sensitive adhesive layer is 1,000 nm.

Examples 2 to 4

(1) Preparation of Aluminum Substrate

Molten metal was prepared using an aluminum alloy containing Si: 0.06% by mass, Fe: 0.30% by mass, Cu: 0.005% by mass, Mn: 0.001% by mass, Mg: 0.001% by mass, Zn: 0.001% by mass, and Ti: 0.03% by mass, and a balance consisting of Al and unavoidable impurities and a molten metal treatment and filtration were carried out. Then, an ingot having a thickness of 500 mm and a width of 1,200 mm was prepared by a DC casting method.

Next, the surface of the resulted ingot was cut by a facing machine so as to have an average thickness of 10 mm and then heated at 550° C. for about 5 hours to carry out a soaking treatment. When the temperature decreased to 400° C., the ingot was formed into a rolled plate having a thickness of 2.7 mm by using a hot roller.

Further, the heating treatment was conducted at 500° C. using a continuous annealing machine and then the annealed plate were cold-rolled to finish the plate to have a thickness of 1.0 mm, thereby obtaining a JIS 1050 aluminum substrate.

The aluminum substrate was cut into a width of 1,030 mm and then subjected to the respective treatments described below.

(2) Electropolishing Treatment

The aluminum plate is subjected to an electropolishing treatment using an electropolishing solution having the following composition under the conditions of a voltage of 25 V, a solution temperature of 65° C., and a solution flow rate of 3.0 m/min.

A carbon electrode was used as a cathode and GP0110-30R (manufactured by TAKASAGO LTD.) was used as a power supply. The flow velocity of the electrolytic solution was measured using a VORTEX FLOW MONITOR FLM 22-10 PCW (manufactured by AS ONE Corporation).

(Composition of Electropolishing Solution)

85 mass % phosphoric acid (manufactured by Wako Pure Chemical Industries, Ltd.): 660 mL Pure water 160 mL Sulfuric acid: 150 mL Ethylene glycol: 30 mL (3) Anodization Treatment Step Subsequently, an anodization treatment using a self-ordering method was carried out on the aluminum substrate subjected to the electropolishing treatment according to the procedure described in JP2007-204802A.

The aluminum substrate subjected to the electropolishing treatment was subjected to 5 hours of a preliminary anodization treatment with an electrolytic solution of 0.50 mol/L oxalic acid under the following conditions: voltage: 40 V; solution temperature: 16° C.; and solution flow velocity: 3.0 m/min.

After preliminary anodization, the aluminum substrate was subjected to a film removal treatment in which the substrate was immersed for 12 hours in a mixed aqueous solution (solution temperature: 50° C.) of 0.2 mol/L chromic anhydride and 0.6 mol/L phosphoric acid.

Then, the aluminum substrate was subjected to 10 hours of a re-anodization treatment with an electrolytic solution of 0.50 mol/L oxalic acid under the following conditions: voltage, 40 V; solution temperature, 16° C.; and solution flow velocity, 3.0 m/min. An anodized film having a thickness of 80 µm was thus obtained.

The preliminary anodization treatment and the re-anodization treatment were both carried out using a stainless steel electrode as the cathode and using a GP0110-30R (manufactured by Takasago, Ltd.) as the power supply. NEO-COOL BD36 (Yamato Scientific Co., Ltd.) was used as the cooling system, and PAIRSTIRRER PS-100 (manufactured by Tokyo Rikakikai Co., Ltd.) was used as the stirring and warming unit. In addition, the flow velocity of the electrolytic solution was measured using the vortex flow monitor FLM22-10PCW (manufactured by As One Corporation).

(4) Barrier Layer Removal Step

Next, using the same treatment liquid as in the anodization treatment under the same conditions as in the anodic oxidation treatment, an electrolytic treatment (electrolytic removal treatment) was carried out while continuously decreasing the voltage from 40 V to 0 V at a voltage decrease rate of 0.2 V/sec.

Then, an etching treatment (etching removal treatment) of immersing the anodized film in 5 mass % phosphoric acid at 30° C. for 30 minutes was carried out. As a result, a barrier layer present in the bottom of the micropores of the anodized film was removed, and aluminum was exposed through the micropores.

Here, the average opening diameter of the micropores present in the anodized film having undergone the barrier layer removal step was 60 nm. The average opening diameter was calculated as the average value of opening diameters measured at 50 positions after capturing a surface image (magnification: 50,000 times) with FE-SEM.

In addition, the average thickness of the anodized film having undergone the barrier layer removal step was 80 µm. The average thickness was calculated as the average value of thicknesses measured at 10 positions after cutting the anodized film with FIB in a thickness direction and capturing a surface image (magnification: 50,000 times) of a cross-section thereof with FE-SEM.

In addition, the density of the micropores present in the anodized film was about 100,000,000 pores/mm$^2$. The density of the micropores was measured and calculated using the method described in paragraphs [0168] and [0169] of JP2008-270158A.

In addition, the degree of regularity of the micropores present in the anodized film was 92%. The degree of regularity was measured and calculated using the method described in paragraphs [0024] to [0027] of JP2008-270158A after capturing a surface image (magnification: 20,000 times) with FE-SEM.

(5) Metal Filling Step (Electroplating Treatment)

Next, an electroplating treatment was carried out by using the aluminum substrate as a cathode and using platinum as a positive electrode.

Specifically, constant current electrolysis was carried out using a copper plating solution having the following composition. As a result, a metal filled microstructure was prepared in which the micropores were filled with copper.

Here, the constant-current electrolysis was carried out using a plating apparatus (manufactured by Yamamoto-MS Co., Ltd.) and a power supply (HZ-3000, manufactured by Hokuto Denko Corp.) under the following conditions after carrying out cyclic voltammetry in the plating solution.

(Composition of Copper Plating Solution and Conditions)

Copper sulfate: 100 g/L

Sulfuric acid: 50 g/L

Hydrochloric acid: 15 g/L

Temperature: 25° C.

Current density: 10 A/dm$^2$

The surface of the anodized film in which the micropores were filled with the metal was observed with FE-SEM, and whether or not 1,000 micropores were sealed with the metal was determined to calculate a pore sealing ratio (the number of sealed micropores/1,000 pores). At this time, the pore sealing ratio was 96%.

In addition, the anodized film in which the micropores were filled with the metal was cut using FIB in a thickness direction, a surface image (magnification: 50,000 times) of a cross-section was obtained with FE-SEM, and the inside of the micropores was observed. At this time, it was found that the sealed micropores were completely filled with the metal.

(6) Substrate Removal Step

Next, the aluminum substrate was removed by dissolution by being dipped in 20 mass % mercury chloride aqueous solution (corrosive sublimate) at 20° C. for 3 hours. Thus, a metal filled microstructure was prepared.

(7) Trimming Step

Next, the metal filled microstructure was immersed in an aqueous sodium hydroxide solution (concentration: 5 mass %, liquid temperature: 20° C.) and the time of immersion was changed to have a height of the protrusion shown in Table 1 below. The surface of the anodized film of aluminum was selectively dissolved to cause the copper columns which are conductive paths to protrude, thereby preparing a structure.

Next, the prepared structure was washed with water and dried, and then was observed with a field emission scanning electron microscope (FE-SEM). The height of the protrusions of the conductive paths, the diameter of the protrusions of the conductive paths, and the aspect ratio (height of protrusion/diameter of protrusion) were measured. The results are shown in Table 1 below.

(8) Pressure Sensitive Adhesive Layer Forming Step

A pressure sensitive adhesive layer was formed on the structure subjected to the trimming step by the following manner. An anisotropic conductive member in which the type of the pressure sensitive adhesive layer was changed was prepared.

<Polyimide Resin A>

As a commercially available product of a polyamide acid ester solution (including dimethyl sulfoxide, trialkoxy amide carboxy silane, and oxime derivatives) using gamma-butyrolactone as a solvent, LTC 9320 (manufactured by Fuji Film Electronics Materials Co., Ltd.) was used.

The solution was applied to the surface of the insulating base in which the conductive paths protrude and dried to form a film. Then, an imidization reaction was allowed to proceed at 200° C. for 3 hours in a nitrogen-purged reaction furnace (oxygen concentration of 10 ppm or less) to form a pressure sensitive adhesive layer made of a polyimide resin layer. The thickness of the pressure sensitive adhesive layer was adjusted by adding a solvent (MEK) so as to have the value shown in Table 1 below.

<Polyimide Resin B>

A coating solution having the following composition was prepared and then filtered through a polypropylene filter having a opening diameter of 0.2 µm.

Next, the filtered coating solution was applied to the surface of the insulating base in which the conductive paths protrude and dried. Then, the coating solution was baked at 230° C. for 1 hour to form a pressure sensitive adhesive layer made of a polyimide resin layer. The thickness of the pressure sensitive adhesive layer was adjusted by further adding a solvent (MEK) having the following formulation so as to have the value shown in Table 1 below.

(Composition of Coating Solution)
Polyimide represented by the following formula: 10.00% by mass
Methyl ethyl ketone (MEK): 90.00% by mass

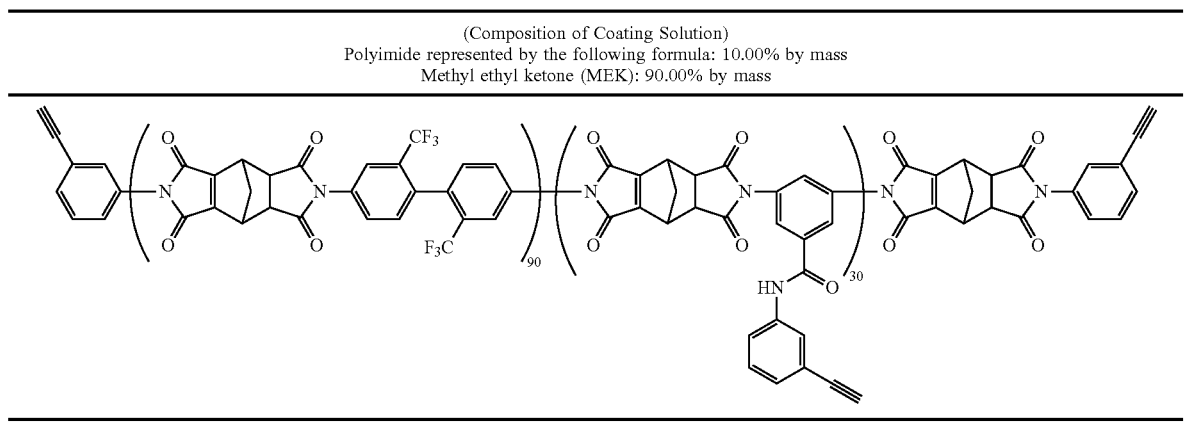

<Epoxy Resin C>

The components shown below were dissolved in methyl ethyl ketone at the following ratio to prepare a resin layer coating solution having a solid content concentration of 23.6% to 60.6% by weight.

The coating solution was applied to the surface of the insulating base in which the conductive paths protrude and dried. Then, the coating solution was further baked at 130° C. for 2 minutes to form a pressure sensitive adhesive layer.

The thickness of the pressure sensitive adhesive layer was adjusted by further adding a solvent (MEK) having the following formulation so as to have the value shown in Table 1 below.

In addition, the applied coating solution was dried at a temperature of 50° C. under reduced pressure of a degree of pressure reduction of −400 mmH$_2$O to avoid surface solidification of the pressure sensitive adhesive layer.

<Coating Solution Composition>

Elastomer: acrylic acid ester-based polymer having butyl acrylate acrylonitrile as a main component (trade name: SG-28GM, manufactured by Nagase ChemteX Corporation) 5 parts by mass Epoxy resin 1: jER (registered trademark) 828 (manufactured by Mitsubishi Chemical Corporation) 33 parts by mass Epoxy resin 2: jER (registered trademark) 1004 (manufactured by Mitsubishi Chemicals Corporation) 11 parts by mass Phenolic resin: MILEX XLC-4L (manufactured by Mitsui Chemicals, Inc.) 44 parts by mass Organic acid: o-anisic acid (ortho anisic acid, manufactured by Tokyo Chemical Industry Co., Ltd.) 0.5 parts by mass Curing Agent: imidazole catalyst (2PHZ-PW, manufactured by Shikoku Chemicals Corporation) 0.5 parts by mass Example 5

An anisotropic conductive member was prepared in the same manner as in Example 2 except that the height of the protrusions of the conductive paths and the thickness of the pressure sensitive adhesive layer were adjusted so as to have the values shown in Table 1 below.

Comparative Example 1

An anisotropic conductive member was prepared in the same manner as in Example 2 except that the height of the protrusions of the conductive paths and the thickness of the pressure sensitive adhesive layer were adjusted so as to have the values shown in Table 1 below and the ends of the protrusions of the conductive paths were covered by the pressure sensitive adhesive layer.

Comparative Example 2

An anisotropic conductive member was prepared in the same manner as in Example 2 except that instead of the pressure sensitive adhesive layer forming step to be carried out after the trimming step, a polymer layer of a radical polymerizable monomer was formed by the method described in paragraph [0109] of JP2010-067589A to have a thickness of 100 μm and the ends of the protrusions of the conductive paths were covered by the pressure sensitive adhesive layer.

Comparative Example 3

An anisotropic conductive member was prepared in the same manner as in Example 3 except that the pressure sensitive adhesive layer was not used.

[Evaluation (Part 1)]

<Conduction Reliability>

A TEG chip (daisy chain pattern) having a Cu pad was prepared. The insulating layer was made of SiN and a step difference between the insulating layer and the surface of the Cu pad was 200 nm. The TEG chip had a chip size of 8 mm square and two types of chips in which a rate of the electrode area (copper post) to the chip area was 10% or 20% prepared.

Next, a Cu chip in which a film of Cu having a thickness of 100 nm was formed over the entire surface of the Si wafer was prepared. A total thickness variation (TTV) which indicates the degree of flatness was 50 nm. As the Cu chip, a Cu chip having a chip size of 3 m square was used.

Next, a sample was prepared by bonding the TEG ship, the prepared anisotropic conductive member, and the Cu chip using a room temperature bonding apparatus (WP-100, manufactured by PMT Corporation) under the connection conditions shown in Table 1 below such that the TEG ship, the prepared anisotropic conductive member, and the Cu chip were laminated in this order.

Then, a signal line for resistance measurement was soldered to the TEG chip of the sample and the soldered sample was dried at 125° C. for 24 hours and further subjected to a moisture absorbing treatment at 85° C. and 60% RH for 168 hours. Subsequently, a solder reflow treatment step (maximum temperature: 265° C.) was carried out three times.

The sample through the above history was supplied to a temperature cycle test under the condition of (−65° C./+150° C.).

The resistance value was measured for each $100^{th}$ cycle and $1,000^{th}$ cycle. In a case in which the rate of change of the resistance value (resistance value at $1,000^{th}$ cycle/resistance value at $100^{th}$ cycle) was less than 5%, the case was evaluated as "AA", in a case in which the rate of change of the resistance value was 5% or more and less than 10%, the case was evaluated as "A", a case in which the range of change of the resistance value was 10% or more and less than 20%, the case was evaluated as "B", in a case in which the rate of change of the resistance value was 20% or more and less than 40%, the case was evaluated as "C", and in a case in which the rate of change of the resistance value was 40% or more, the case was "D". The results are shown in Table 2 below. In the case in which leakage occurs in the middle of the test, evaluation was made based on the change in resistance at the time of the occurrence of leakage.

<Adhesiveness>

A load was applied to the TEG chip of the sample for evaluation of conduction reliability, and the peeling strength was measured using a universal bonding tester (DAGE 4000, manufactured by Nordson Corporation).

As a result, a case in which the peeling strength was 15 N or more, the case was evaluated as "A", a case in which the peeling strength was 10 N or more and less than 15 N, the case was evaluated as "B", and a case in which the peeling strength was less than 10 N, the case was evaluated as "C". The results are shown in Table 2 below.

[Evaluation (Part 2)]

As samples for evaluation of conduction reliability and adhesiveness of the anisotropic conductive members prepared in Examples 3 and 4, samples prepared under the following conditions were evaluated. The results are shown in Table 2 below.

<Sample Preparation Conditions>

Each sample was prepared by bonding the TEG ship, the prepared anisotropic conductive member, and the Cu chip using a room temperature bonding apparatus (WP-100, manufactured by PMT Corporation) under the conditions in which the members were kept at 200° C. and 8 kg/cm² for 5 minutes such that the TEG chip, the prepared anisotropic conductive member, and the Cu chip were laminated in this order.

[Evaluation (Part 3)]

As samples for evaluation of conduction reliability and adhesiveness of the anisotropic conductive members prepared in Example 4 and Comparative Example 1, samples prepared under the following conditions were evaluated. The results are shown in Table 2 below.

<Sample Preparation Conditions>

Each sample was prepared by bonding the TEG ship, the prepared anisotropic conductive member, and the Cu chip using a room temperature bonding apparatus (WP-100, manufactured by PMT Corporation) under the conditions in which the members were kept at 200° C. and 100 kg/cm² for 5 minutes such that the TEG chip, the prepared anisotropic conductive member, and the Cu chip were laminated in this order.

[Evaluation (Part 4)]

As samples for evaluation of conduction reliability and adhesiveness of the anisotropic conductive members prepared in Examples 3 and 4, samples prepared under the following conditions were evaluated. The results are shown in Table 2 below.

<Sample Preparation Conditions>

Each sample was prepared under the same conditions as in Evaluation (Part 1) except that the prepared anisotropic conductive member before the TEG ship was laminated was left to stand still in a formic acid atmosphere at 200° C. for 10 min and the oxide film considered to be formed on the ends (end surfaces) of the protrusions of the conductive paths was removed.

[Evaluation (Part 5)]

Each sample for evaluation of the anisotropic conductive members prepared in Examples 1 to 4 and Comparative Example 1 was prepared under the same conditions as in Evaluation (Part 1) except that the TEG chip shown below was used. The sample was used to evaluate the conduction reliability and the adhesiveness.

<TEG Chip>

A TEG chip (daisy chain pattern) having a Cu pad was prepared. The insulating layer was a polyimide layer (PIMEL (registered trademark)-BL, manufactured by Kasei E-Materials Co., Ltd.), and a step difference between the insulating layer and the Cu pad was 200 nm.

TABLE 1

| First Table (Part 1) | Insulating base | | Conductive path | | | | Pressure sensitive adhesive layer | |
|---|---|---|---|---|---|---|---|---|
| | | | | Protrusion | | | | |
| | Type | Thickness [μm] | Type | Height [nm] | Diameter [nm] | Aspect ratio | Thickness [nm] | Type |
| EXAMPLE 1 | Glass | 300 | Copper | 1,050 | 1,000 | 1.05 | 1,000 | Polyimide resin Epoxy resin |
| EXAMPLE 2 | Aluminum oxide | 3 | Copper | 1,020 | 60 | 17.0 | 1,000 | Polyimide resin A Polyimide resin B Epoxy resin C |
| EXAMPLE 3 | Aluminum oxide | 3 | Copper | 520 | 60 | 8.7 | 500 | Polyimide resin A Polyimide resin A Polyimide resin A Polyimide resin A Polyimide resin A Polyimide resin A Polyimide resin A Polyimide resin A Polyimide resin B Epoxy resin C |
| EXAMPLE 4 | Aluminum oxide | 3 | Copper | 220 | 60 | 3.7 | 200 | Polyimide resin A Polyimide resin B Epoxy resin C |
| EXAMPLE 5 | Aluminum oxide | 3 | Copper | 520 | 60 | 8.7 | 200 | Polyimide resin A |

| First Table (Part 1) | Pressure sensitive adhesive layer Thermal expansion coefficient [×10$^{-6}$ K$^{-1}$] | Chip used | | Connection condition (Evaluation part 1) | | | |
|---|---|---|---|---|---|---|---|
| | | TEG chip Electrode area ratio | Cu chip Size | Pressure (kg/cm$^2$) | Temperature (° C.) | Time (min) | Atmosphere |
| EXAMPLE 1 | 65 | 10% | 3 | 40 | 200 | 5 | Vacuum |
| | 75 | 10% | 3 | 40 | 200 | 5 | Vacuum |
| EXAMPLE 2 | 46 | 10% | 3 | 40 | 200 | 5 | Vacuum |
| | 34 | 10% | 3 | 40 | 200 | 5 | Vacuum |
| | 62 | 10% | 3 | 40 | 200 | 5 | Vacuum |
| EXAMPLE 3 | 46 | 10% | 3 | 40 | 200 | 5 | Vacuum |
| | 46 | 20% | 3 | 40 | 200 | 5 | Air |
| | 46 | 20% | 3 | 40 | 200 | 1 | Air |
| | 46 | 20% | 3 | 7.5 | 250 | 1 | Air |
| | 46 | 20% | 3 | 6 | 250 | 1 | Air |
| | 46 | 20% | 3 | 7.5 | 300 | 1 | Air |
| | 46 | 20% | 3 | 6 | 300 | 1 | Air |
| | 46 | 20% | 3 | 4 | 300 | 1 | Air |
| | 34 | 10% | 3 | 40 | 200 | 5 | Vacuum |
| | 62 | 10% | 3 | 40 | 200 | 5 | Vacuum |
| EXAMPLE 4 | 46 | 10% | 3 | 40 | 200 | 5 | Vacuum |
| | 34 | 10% | 3 | 40 | 200 | 5 | Vacuum |
| | 62 | 10% | 3 | 40 | 200 | 5 | Vacuum |
| EXAMPLE 5 | 46 | 20% | 3 | 7.5 | 300 | 1 | Air |

TABLE 2

| First Table (Part 2) | Insulating base | | Conductive path | | | Pressure sensitive adhesive layer | |
|---|---|---|---|---|---|---|---|
| | | | Protrusion | | | | |
| | Type | Thickness [μm] | Type | Height [nm] | Diameter [nm] | Aspect ratio | Thickness [nm] | Type |

| First Table (Part 2) | Type | Thickness [μm] | Type | Height [nm] | Diameter [nm] | Aspect ratio | Thickness [nm] | Type |
|---|---|---|---|---|---|---|---|---|
| COMPARATIVE EXAMPLE 1 | Aluminum oxide | 3 | Copper | 520 | 60 | 8.7 | 1,000 | Polyimide resin A Polyimide resin B Epoxy resin C |
| COMPARATIVE EXAMPLE 2 | Aluminum oxide | 3 | Copper | 520 | 60 | 8.7 | 100,000 | Polymer layer* |
| COMPARATIVE EXAMPLE 3 | Aluminum oxide | 3 | Copper | 520 | 60 | 8.7 | — | — |

| First Table (Part 2) | Pressure sensitive adhesive layer Thermal expansion coefficient [×10$^{-6}$ K$^{-1}$] | Chip used | | Connection condition (Evaluation part 1) | | | |
|---|---|---|---|---|---|---|---|
| | | TEG chip Electrode area ratio | Cu chip Size | Pressure (kg/cm$^2$) | Temperature (° C.) | Time (min) | Atmosphere |
| COMPARATIVE EXAMPLE 1 | 46 | 10% | 3 | 40 | 200 | 5 | Vacuum |
| | 34 | 10% | 3 | 40 | 200 | 5 | Vacuum |
| | 62 | 10% | 3 | 40 | 200 | 5 | Vacuum |
| COMPARATIVE EXAMPLE 2 | Polymer layer* | 10% | 3 | 40 | 200 | 5 | Vacuum |
| | | 10% | 3 | 40 | 200 | 5 | Vacuum |
| COMPARATIVE EXAMPLE 3 | — | 20% | 3 | 7.5 | 300 | 1 | Air |

*In Comparative Example 2, the polymer layer described in paragraph [0109] of JP2010-067589A was used.

TABLE 3

| Second table (Part 1) | Evaluation (Part 1) | | Evaluation (Part 2) | | Evaluation (Part 3) | | Evaluation (Part 4) | | Evaluation (Part 5) | |
|---|---|---|---|---|---|---|---|---|---|---|
| | Conduction reliability | Adhesiveness | Conduction reliability | Adhesiveness | Conduction reliability | Adhesiveness | Conduction reliability | Adhesiveness | Conduction reliability | Adhesiveness |
| EXAMPLE 1 | AA | A | — | — | — | — | — | — | AA | A |
| | B | A | — | — | — | — | — | — | B | A |
| EXAMPLE 2 | AA | A | — | — | — | — | — | — | AA | A |
| | AA | A | — | — | — | — | — | — | AA | A |
| | B | A | — | — | — | — | — | — | B | A |
| EXAMPLE 3 | A | A | B | A | — | — | A | A | A | A |
| | A | A | B | A | — | — | AA | A | A | A |
| | B | B | B | C | — | — | AA | A | A | A |
| | A | A | B | B | — | — | A | A | A | A |
| | A | B | B | B | — | — | A | A | A | A |
| | AA | A | A | A | — | — | AA | A | A | A |
| | AA | A | A | A | — | — | AA | A | A | A |
| | A | A | B | A | — | — | A | A | A | A |
| | A | B | A | B | — | — | A | B | A | A |
| | B | A | B | A | — | — | A | A | B | A |
| EXAMPLE 4 | B | A | B | A | A | A | A | A | B | A |
| | B | B | B | B | A | B | A | B | B | A |
| | C | A | C | A | A | A | B | A | C | A |
| EXAMPLE 5 | C | B | — | — | — | — | — | — | — | — |

TABLE 4

| Second table (Part 2) | Evaluation (Part 1) | | Evaluation (Part 2) | | Evaluation (Part 3) | | Evaluation (Part 4) | | Evaluation (Part 5) | |
|---|---|---|---|---|---|---|---|---|---|---|
| | Conduction reliability | Adhesiveness | Conduction reliability | Adhesiveness | Conduction reliability | Adhesiveness | Conduction reliability | Adhesiveness | Conduction reliability | Adhesiveness |
| COMPARATIVE EXAMPLE 1 | D | A | — | — | C | A | — | — | D | A |
| | D | A | — | — | C | A | — | — | D | A |
| COMPARATIVE EXAMPLE 2 | D | C | — | — | — | — | — | — | — | — |
| | D | C | — | — | — | — | — | — | — | — |
| | D | C | — | — | — | — | — | — | — | — |

TABLE 4-continued

| Second table (Part 2) | Evaluation (Part 1) | | Evaluation (Part 2) | | Evaluation (Part 3) | | Evaluation (Part 4) | | Evaluation (Part 5) | |
|---|---|---|---|---|---|---|---|---|---|---|
| | Conduction reliability | Adhesiveness | Conduction reliability | Adhesiveness | Conduction reliability | Adhesiveness | Conduction reliability | Adhesiveness | Conduction reliability | Adhesiveness |
| COMPARATIVE EXAMPLE 3 | D | C | — | — | — | — | — | — | — | — |

As seen from the results shown in Tables 1 and 2, the adhesiveness of the sample of Comparative Example 1 in which the ends of the protrusions of the conductive paths were covered by the pressure sensitive adhesive layer was good but the conduction reliability was low.

In addition, it was found that the adhesiveness and the conduction reliability of the sample of Comparative Example 2 in which the ends of the protrusions of the conductive paths were covered by the radical polymerizable polymer both deteriorated.

In addition, it was found that the adhesiveness and the conduction reliability of the sample of Comparative Example 3 in which the pressure sensitive adhesive layer was not used both deteriorated.

In contrast, it was found that the adhesiveness of all samples in Examples 1 to 5 in which the ends of the protrusions of the conductive paths were exposed or protruded from the surface of the pressure sensitive adhesive layer was good irrespective of the type of the insulating layer of the substrate to be bonded and the conduction reliability was excellent.

Particularly, as seen from the results of Examples 1 and 2, when an anodized film of aluminum was used as the insulating base, the adhesiveness with the wiring substrate was good.

In addition, as seen from the results of Examples 2 to 4, when the protrusions of the conductive paths and the thickness of the pressure sensitive adhesive layer were thick, the conduction reliability was further improved.

Further, as seen from the results of each of Examples, when a polyimide resin was used as the pressure sensitive adhesive layer, the conduction reliability was further improved.

Further, as seen from the results of Example 3, satisfactory conduction reliability and adhesiveness could be obtained even during a short period of connection time by controlling the connection conditions.

Further, as seen from the results of Examples 3 and 4, when a high pressure was applied at the time of pressure application, the conduction reliability tended to be further improved. Similarly, it was found that when the oxide film of the ends (end surfaces) of the protrusions of the conductive paths was removed, the conduction reliability was further improved.

Further, it was found that from the comparison of Examples 1 to 4 and 5, an absolute value of a difference between the height of the protrusions of the conductive paths and the thickness of the pressure sensitive adhesive layer was 0 nm to 50 nm, the contact resistance was small and the conduction reliability was further improved.

EXPLANATION OF REFERENCES

1: anisotropic conductive member
2: insulating base
3: conductive path
3a, 3b: protrusion of conductive path
4: pressure sensitive adhesive layer
6: thickness of insulating base
7: width between conductive paths
8: diameter of conductive path
9: center-to-center distance (pitch) between conductive paths
10: multilayer wiring substrate
11a, 11b: wiring substrate
12a, 12b: electrode
30: bonding chamber
31: substrate holder with heating mechanism
32: target member
33: moving mechanism
34: flow mechanism
35: treatment gas introduction mechanism
36: treatment chamber
37: load lock mechanism
38: chamber door
40: gap filling agent
42: insulating layer
44: MEMS device
46: sealing portion
48: heat dissipation constructive electrode
71: winding core
72: peeling film

What is claimed is:

1. An anisotropic conductive member comprising:
an insulating base which is made of an inorganic material;
a plurality of conductive paths which are made of a conductive member, penetrate the insulating base in a thickness direction thereof and are provided in a mutually insulated state; and
a pressure sensitive adhesive layer which is provided on a surface of the insulating base,
wherein each of the conductive paths has a protrusion which protrudes from the surface of the insulating base,
wherein an end of the protrusion of each of the conductive paths protrudes from the surface of the pressure sensitive adhesive layer, and
wherein an absolute value of a difference between the height of the protrusion of each of the conductive paths and the thickness of the pressure sensitive adhesive layer is 0 nm to 50 nm.

2. The anisotropic conductive member according to claim 1,
wherein an aspect ratio of the protrusion of each of the conductive paths is 0.01 or more and less than 20, and
wherein the aspect ratio is a ratio of height to diameter of the protrusion.

3. The anisotropic conductive member according to claim 2,
wherein the height of the protrusion of each of the conductive paths is 50 nm to 1,500 nm.

4. The anisotropic conductive member according to claim 3,
wherein a thickness of the pressure sensitive adhesive layer is 50 nm to 1,500 nm.

5. The anisotropic conductive member according to claim 2,
wherein a thickness of the pressure sensitive adhesive layer is 50 nm to 1,500 nm.

6. The anisotropic conductive member according to claim 1,
wherein the height of the protrusion of each of the conductive paths is 50 nm to 1,500 nm.

7. The anisotropic conductive member according to claim 6,
wherein a thickness of the pressure sensitive adhesive layer is 50 nm to 1,500 nm.

8. The anisotropic conductive member according to claim 1,
wherein a thickness of the pressure sensitive adhesive layer is 50 nm to 1,500 nm.

9. The anisotropic conductive member according to claim 1,
wherein the pressure sensitive adhesive layer is a layer which contains a polymer material having a thermal expansion coefficient of less than $50 \times 10^{-6}$ $K^{-1}$.

10. The anisotropic conductive member according to claim 9,
wherein the polymer material is at least one resin material selected from the group consisting of polyimide resins and epoxy resins.

11. A multilayer wiring substrate in which the anisotropic conductive member according to claim 1 and a wiring substrate which is electrically connected to the conductive material of the anisotropic conductive member via an electrode are laminated.

12. The multilayer wiring substrate according to claim 11 which is used as an interposer for a semiconductor package.

13. . The anisotropic conductive member according to claim 1, wherein the absolute value of the difference between the height of the protrusion of each of the conductive paths and the thickness of the pressure sensitive adhesive layer is greater than 0 nm such that a surface level of the conductive path is not in a same plane with a surface level of the pressure sensitive layer.

14. . The anisotropic conductive member according to claim 1, wherein each of the conductive paths protrudes over a surface of the pressure sensitive adhesive layer by an amount over 0 nm but less than or equal to 50 nm.

* * * * *